(12) United States Patent
Kunishi et al.

(10) Patent No.: US 8,923,781 B2
(45) Date of Patent: Dec. 30, 2014

(54) SEMICONDUCTOR SWITCH AND WIRELESS DEVICE

(75) Inventors: Yugo Kunishi, Kanagawa-ken (JP); Toshiki Seshita, Kanagawa-ken (JP); Yoshitomo Sagae, Kanagawa-ken (JP); Mitsuru Sugawara, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1073 days.

(21) Appl. No.: 12/952,762

(22) Filed: Nov. 23, 2010

(65) Prior Publication Data

US 2011/0159822 A1 Jun. 30, 2011

(30) Foreign Application Priority Data

Dec. 25, 2009 (JP) .................................. 2009-294817
Aug. 11, 2010 (JP) .................................. 2010-180038

(51) Int. Cl.
*H04B 1/44* (2006.01)
*H03K 17/00* (2006.01)
*H03K 17/691* (2006.01)
*H03K 3/354* (2006.01)
*H03K 17/687* (2006.01)

(52) U.S. Cl.
CPC .......... *H03K 17/6871* (2013.01); *H03K 17/005* (2013.01); *H03K 17/691* (2013.01); *H03K 3/354* (2013.01)
USPC .......... 455/78; 455/333; 455/425; 455/550.1; 327/415; 330/51

(58) Field of Classification Search
CPC .................................................. H03K 17/6871
USPC ................. 455/78, 333, 425, 550.1; 327/415; 330/51
See application file for complete search history.

(56) References Cited

U.S. PATENT DOCUMENTS 5,808,947 A * 9/1998 McClure ........................ 365/201
6,804,502 B2 10/2004 Burgener et al.
2007/0290744 A1 12/2007 Adachi

FOREIGN PATENT DOCUMENTS

JP 2005-515657 5/2005

OTHER PUBLICATIONS

Japanese office action issue on Jun. 26, 2013 in the counterpart Japanese patent application No. 2010-180038.

* cited by examiner

*Primary Examiner* — Hsin-Chun Liao
(74) *Attorney, Agent, or Firm* — White & Case LLP

(57) ABSTRACT

According to one embodiment, a semiconductor switch includes a voltage generator, a voltage controller, a driver, and a switch unit. The voltage generator generates a negative first potential. The voltage controller controls the first potential according to a terminal switch signal input from an outside. The driver is input the terminal switch signal, and outputs at least one selected from the first potential and the second potential based on the terminal switch signal. The second potential is a power supply voltage or is higher than the power supply voltage. The switch unit is provided on an SOI substrate, switches a connection between an antenna terminal and any one of high frequency terminals based on the output of the driver.

20 Claims, 21 Drawing Sheets

SEMICONDUCTOR SWITCH AND WIRELESS DEVICE

CROSS-REFERENCE TO RELATED APPLICATIONS

This application is based upon and claims the benefit of priority from Japanese Patent Application No. 2009-294817, filed on Dec. 25, 2009 and Japanese Patent Application No. 2010-180038, filed on Aug. 11, 2010; the entire contents of which are incorporated herein by reference.

FIELD

Embodiments described herein relate generally to a semiconductor switch and a wireless device.

BACKGROUND

More frequency bands are being used by mobile telephones due to an increasing number of mobile telephone users, more communication standards, expansion of services, etc. To prepare independent high frequency devices for such frequencies would undesirably lead to larger sizes and higher costs. Therefore, a high frequency device is shared. As an example, an antenna is shared by using a switch circuit for high frequency signals to connect the antenna to one of desired high frequency circuits.

Although High Electron Mobility Transistors (HEMTs) using compound semiconductors have been used in conventional switch elements of switch circuits for such high frequency signals, it is being studied that HEMTs is replaced with Metal Oxide Semiconductor Field Effect Transistors (MOSFETs) formed on silicon substrates due to the need for lower costs and downsizing.

However, in a general MOSFET formed on a silicon (Si) substrate, parasitic capacitances between the Si substrate and source and drain electrodes is undesirably large and the power loss of the high frequency signal is undesirably high. Therefore, a semiconductor switch formed on a Silicon On Insulator (SOI) substrate has been proposed (for example, refer to JP-A 2005-515657).

Important characteristics necessary for semiconductor switches include insertion loss, isolation between switch ports, etc. Distortion characteristics also are important. A FET included in a semiconductor switch is a semiconductor device and therefore has nonlinearity; when power passes through the FET in ON state, ON distortion occurs due to the nonlinearity; and when power passes through the FET in OFF state, OFF distortion occurs.

When a high frequency signal is input to the semiconductor switch, it is necessary that a sufficiently low negative voltage is applied with respect to an input signal swing so as to reduce the OFF distortion occurring in a FET in the OFF state. However, in a FET formed on a silicon substrate, the negative voltage is too low, the OFF distortion occurring due to the nonlinearity of the FET undesirably increases.

DETAILED DESCRIPTION

Figure 1:
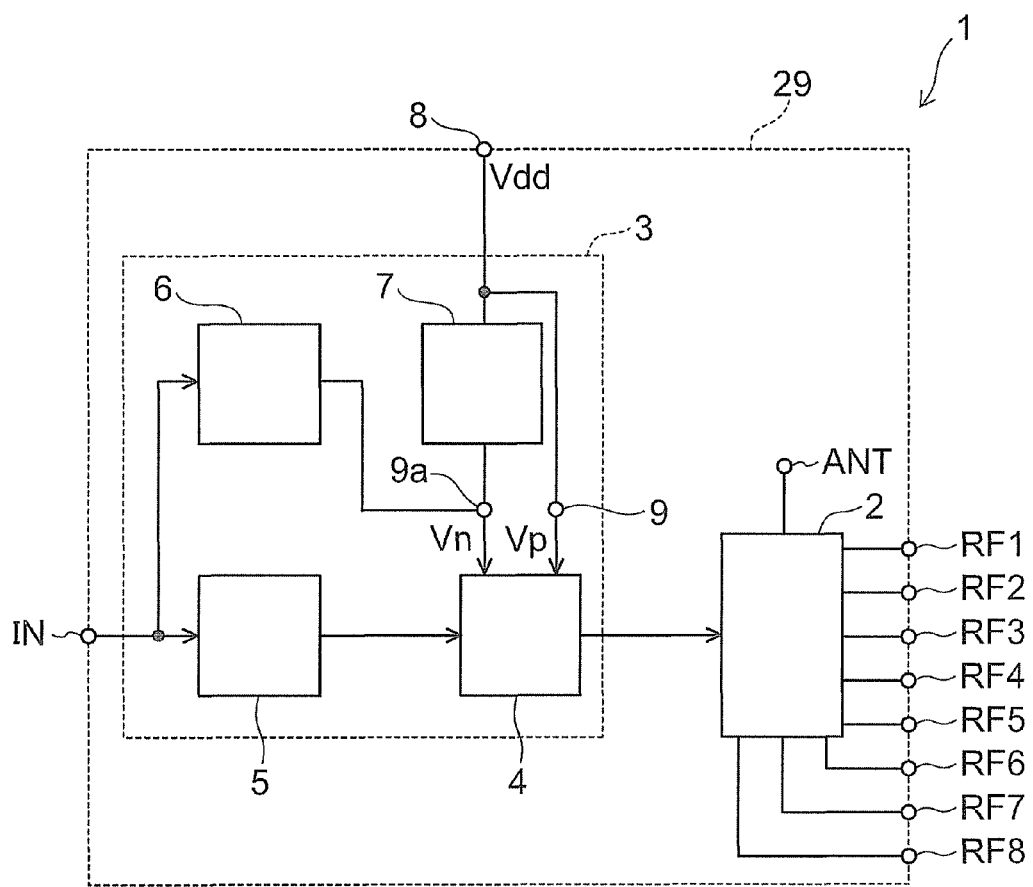
FIG. 1 is a block diagram illustrating the configuration of a semiconductor switch according to an embodiment.

In general, according to one embodiment, a semiconductor switch includes a voltage generator, a voltage controller, a driver, and a switch unit. The voltage generator generates a negative first potential. The voltage controller controls the first potential according to a terminal switch signal input from an outside. The driver is input the terminal switch signal, and outputs at least one selected from the first potential and the second potential by the terminal switch signal. The second potential is a power supply voltage or is higher than the power supply voltage. The switch unit is provided on an SOI substrate, switches a connection between an antenna terminal and any one of high frequency terminals based on the output of the driver.

Embodiments will now be described in detail with reference to the drawings.

In the specification and the drawings of the application, components similar to those described in regard to a drawing thereinabove are marked with like reference numerals, and a detailed description is omitted as appropriate.

FIG. 1 is a block diagram illustrating the configuration of a semiconductor switch according to an embodiment.

As illustrated in FIG. 1, the semiconductor switch 1 includes a switch unit 2, a driver 4, a decoder 5, a voltage controller 6, a voltage generator 7, and a power supply terminal 8. These components are formed on an SOI substrate 29 in a one-chip structure.

The switch unit 2 switches a connection between an antenna terminal ANT and any one of high frequency terminals RF1 to RF8. In FIG. 1, the switch unit 2 is a SP8T (Single-Pole 8-Throw) switch that switches a connection between the antenna terminal ANT and any one of the eight high frequency terminals RF1 to RF8.

For example, in wireless communications using mobile telephones, circuits in which the switch unit 2 includes many high frequency terminals such as SP8T are being used to respond to the emergence of the new communication standard called the Universal Mobile Telecommunications System (UMTS) standard in addition to the currently mainstream Global System for Mobile communications (GSM) standard.

The switch unit 2 includes multiple ports and may be used in wireless devices having such multi modes and multi bands, etc.

High frequency signals having high power levels such as the GSM standard may be input to the odd-numbered high frequency terminals RF1, RF3, RF5, and RF7. High frequency signals having low power levels such as the UMTS standard may be input to the even-numbered high frequency terminals RF2, RF4, RF6, and RF8.

The switch unit 2 includes, for example, MOSFETs.

Figure 2:
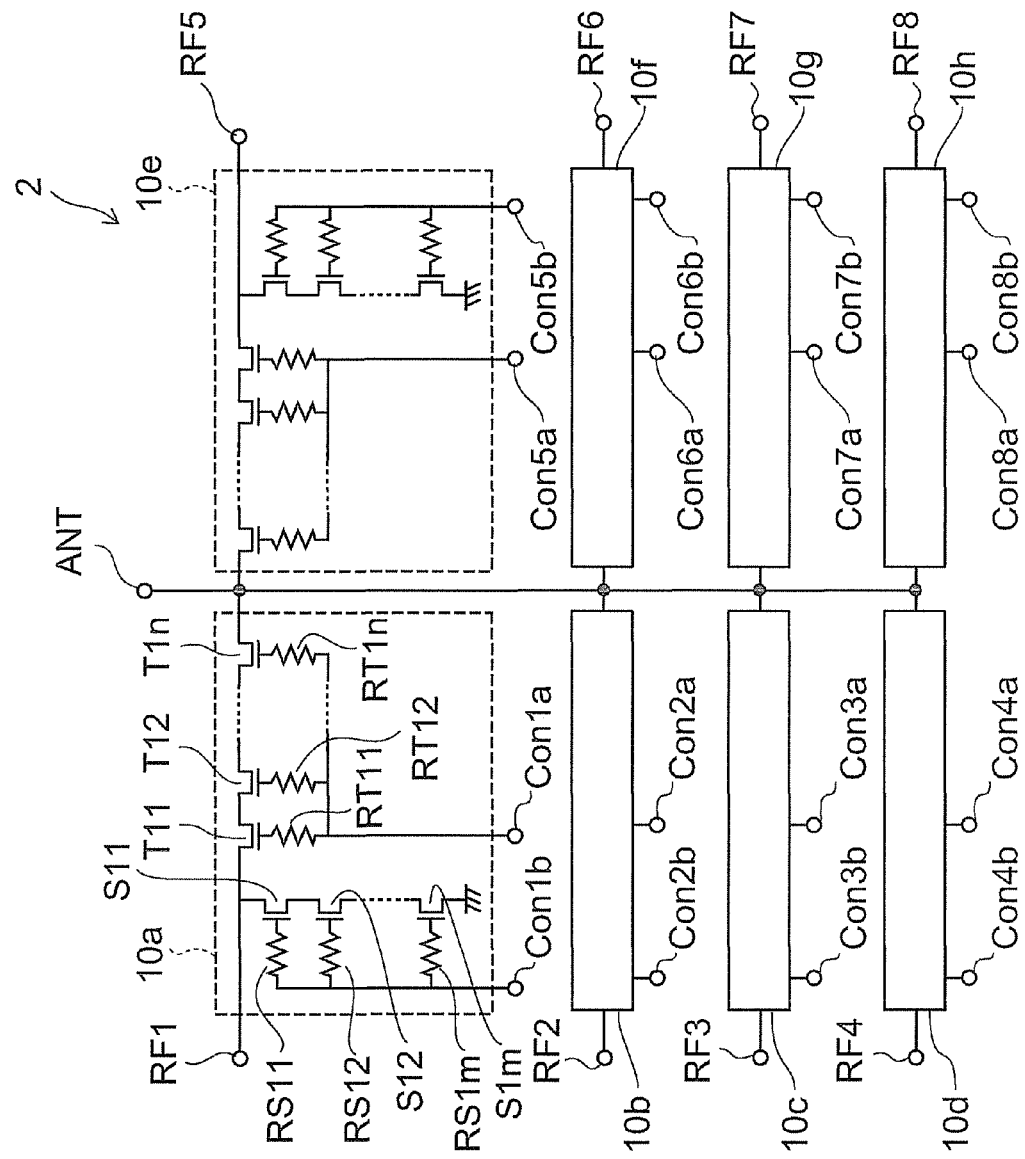
FIG. 2 is a circuit diagram illustrating the configuration of a switch unit of the semiconductor switch illustrated in FIG. 1.

FIG. 2 is a circuit diagram illustrating the configuration of the switch unit of the semiconductor switch illustrated in FIG. 1.

As illustrated in FIG. 2, switch circuits 10a to 10h are connected between the antenna terminal ANT and the high frequency terminals RF1 to RF8, respectively.

Each of the switch circuits 10a to 10h includes n stages (n being an integer not less than 1) of through FETs (Field Effect Transistors), m stages (m being an integer not less than 1) of shunt FETs, and resistors for preventing leakages of high frequency.

The through FETs T11, T12, . . . , and T1n of the switch circuit 10a are connected in series between the antenna terminal ANT and the high frequency terminal RF1. The shunt FETs S11, S12, . . . , and S1m of the switch circuit 10a are connected in series between the high frequency terminal RF1 and the ground.

Gates of the through FETs T11, T12, . . . , and T1n of the switch circuit 10a connected to the high frequency terminal RF1 are connected to a control terminal Con1a via resistors RT11, RT12, . . . , and RT1n for preventing leakages of high frequency, respectively. The control terminal Con1a is connected to the driver 4. Each of the resistors RT11, RT12, . . . , and RT1n has a resistance value high enough that the high frequency signal does not leak to the driver 4.

Gates of the shunt FETs S11, S12, . . . , and S1m of the switch circuit 10a connected to the high frequency terminal RF1 are connected to a control terminal Con1b via resistors RS11, RS12, . . . , and RS1m for preventing leakages of high frequency, respectively. The control terminal Con1b is connected to the driver 4. Each of the resistors RS11, RS12, . . . , and RS1m have resistance values high enough that the high frequency signal does not leak to the driver 4.

Similarly, the through FETs of the switch circuits 10b to 10h are connected between the antenna terminal ANT and the high frequency terminals RF2 to RF8, respectively. The shunt FETs of the switch circuits 10b to 10h are connected between the ground and the high frequency terminals RF2 to RF8, respectively.

Gates of the through FETs of the switch circuits 10b to 10h connected to the high frequency terminals RF2 to RF8 are connected to control terminals Con2a to Con8a via resistors for preventing leakages of high frequency. Each of the control terminals Con2a to Con8a is connected to the driver 4.

Gates of the shunt FETs of the switch circuits 10b to 10h connected to the high frequency terminals RF2 to RF8 are connected to the control terminals Con2b to Con8b via resistors for preventing leakages of high frequency. Each of the control terminals Con2b to Con8b is connected to the driver 4.

For example, to conduct between the high frequency terminal RF1 and the antenna terminal ANT, the n-stage through FETs T11 to T1n connected in series between the high frequency terminal RF1 and the antenna terminal ANT are switched ON and the m-stage shunt FETs S11 to S1m connected in series between the high frequency terminal RF1 and the ground are switched OFF. Simultaneously, it is sufficient that all of the other through FETs between the high frequency terminals RF2 to RF8 and the antenna terminal ANT are switched OFF; and all of the other shunt FETs between the high frequency terminals RF2 to RF8 and the ground are switched ON.

In other words, in the case recited above, an ON potential Von is applied to the control terminal Con1a; the ON potential Von is applied to the control terminals Con2b to Con8b; an OFF potential Voff is applied to the control terminal Con1b; and the OFF potential Voff is applied to the control terminals Con8a to Con8a. The ON potential Von is a gate potential at which each of the FETs is switched to a conducting state and the ON resistance thereof has a sufficiently low value; and the OFF potential Voff is a gate potential at which each of the FETs is switched to an open state and the open state can be sufficiently maintained even when a high frequency signal is superimposed. A threshold voltage Vth of each of the FETs is, for example, 0 V.

In the case where the ON potential Von is lower than the desired potential (e.g., 3.5 V), the ON resistance of the FET in the conducting state increases; the insertion loss deteriorates; and the distortion (the ON distortion) occurring in the FET in the conducting state increases. Further, in the case where the OFF potential Voff is higher than the desired potential (e.g., −1.5 V), the maximum input power decreases; and the distortion (the OFF distortion) occurring in the FET in the open state increases during the specified input.

However, in the case where the ON potential Von is too high or the OFF potential Voff is too low, the breakdown voltage of the FET is undesirably exceeded. Therefore, there exist optimal ranges of the ON potential Von and the OFF potential Voff.

Figure 8:
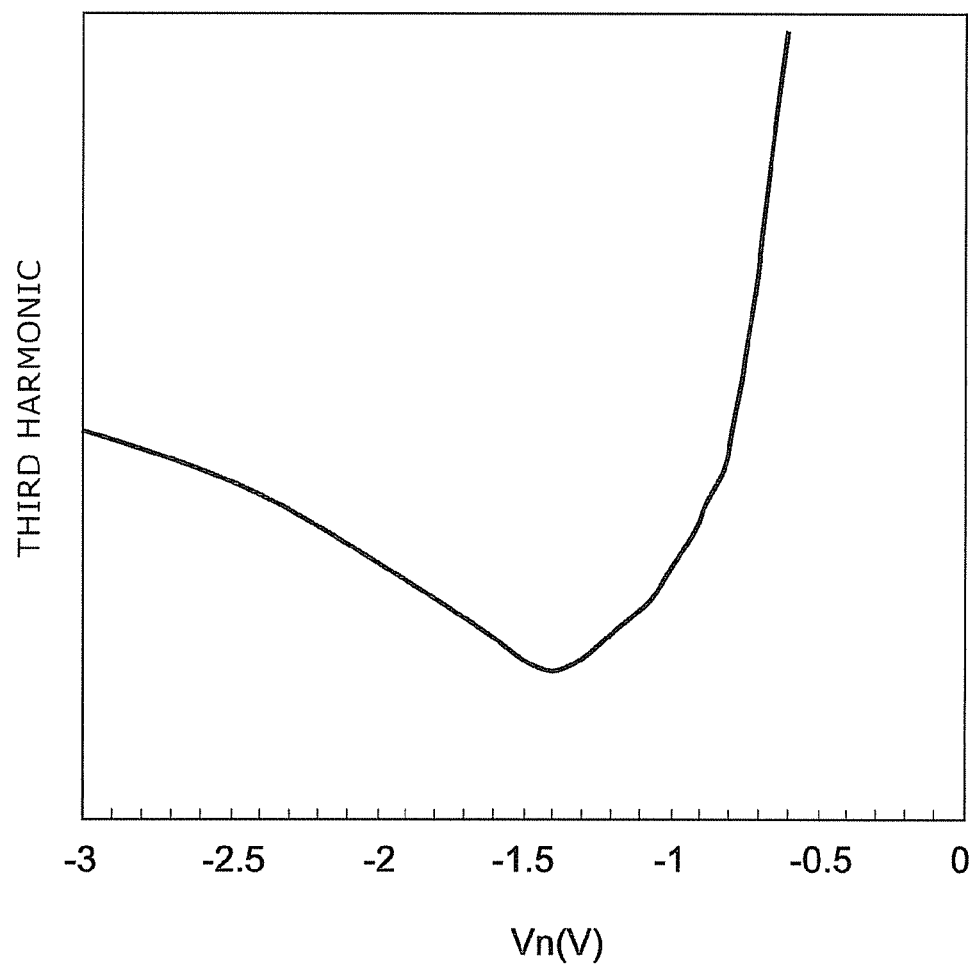
FIG. 8 is a schematic view illustrating the first potential Vn dependency of a third harmonic.
Figure 9:
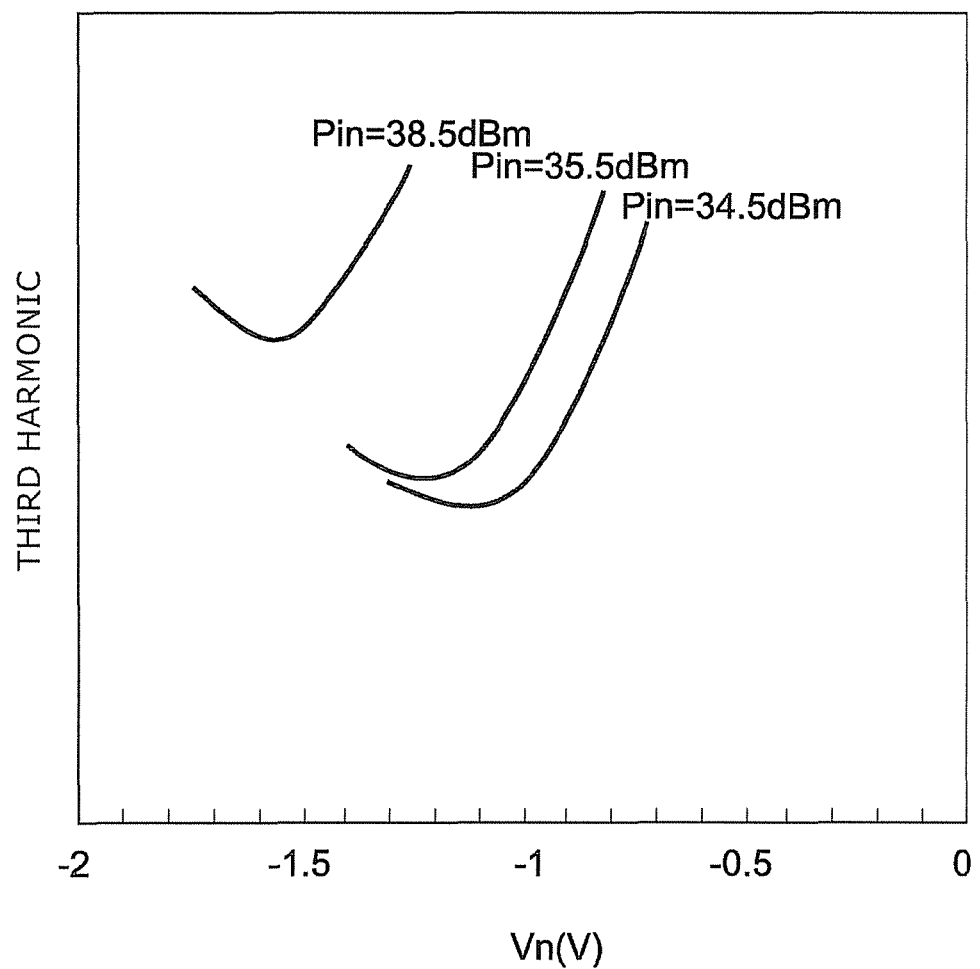
FIG. 9 is a schematic view illustrating the first potential Vn dependency of the third harmonic at various power levels Pin.
Figure 10:
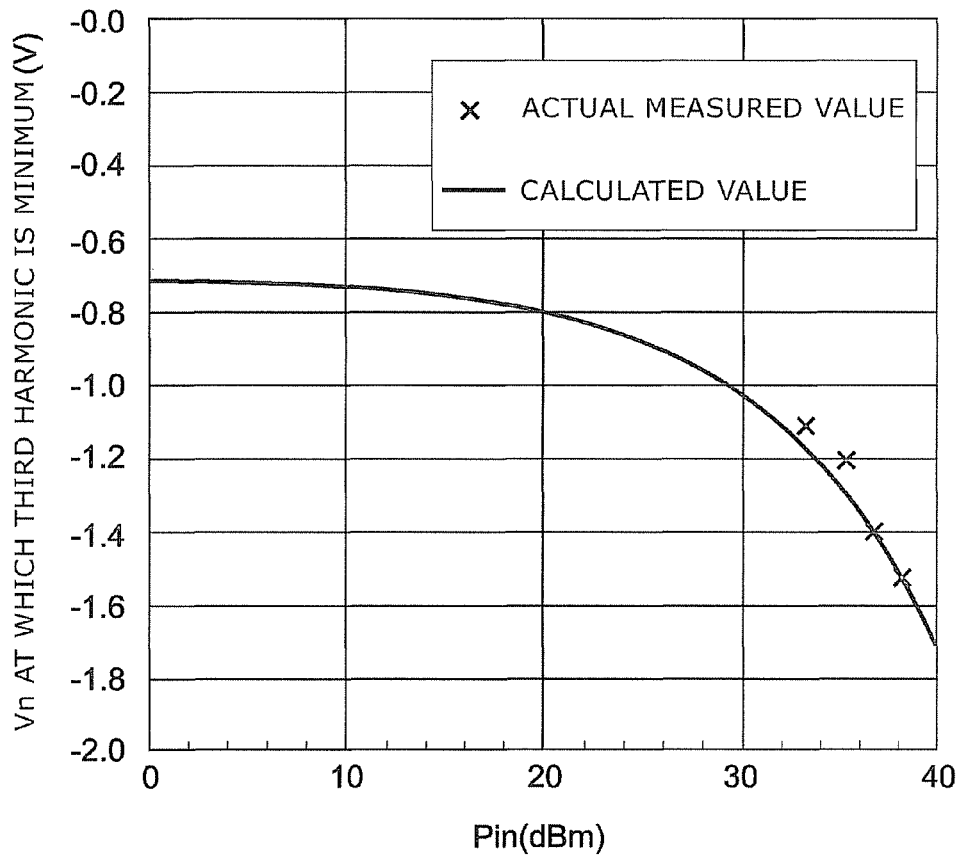
FIG. 10 is a schematic view illustrating the power level Pin dependency of the first potential Vn minimizing the third harmonic.

The optimal value of the OFF potential Voff is described in regard to FIG. 8 to FIG. 10.

The control signal controlling the gate potential of each of the FETs of the switch unit 2 is generated in a controller unit 3 illustrated in FIG. 1.

The controller unit 3 includes the driver 4 for driving the switch unit 2, the decoder 5 that decodes the terminal switch signal input to a terminal IN, the voltage controller 6, the voltage generator 7, and the like.

Figure 3:
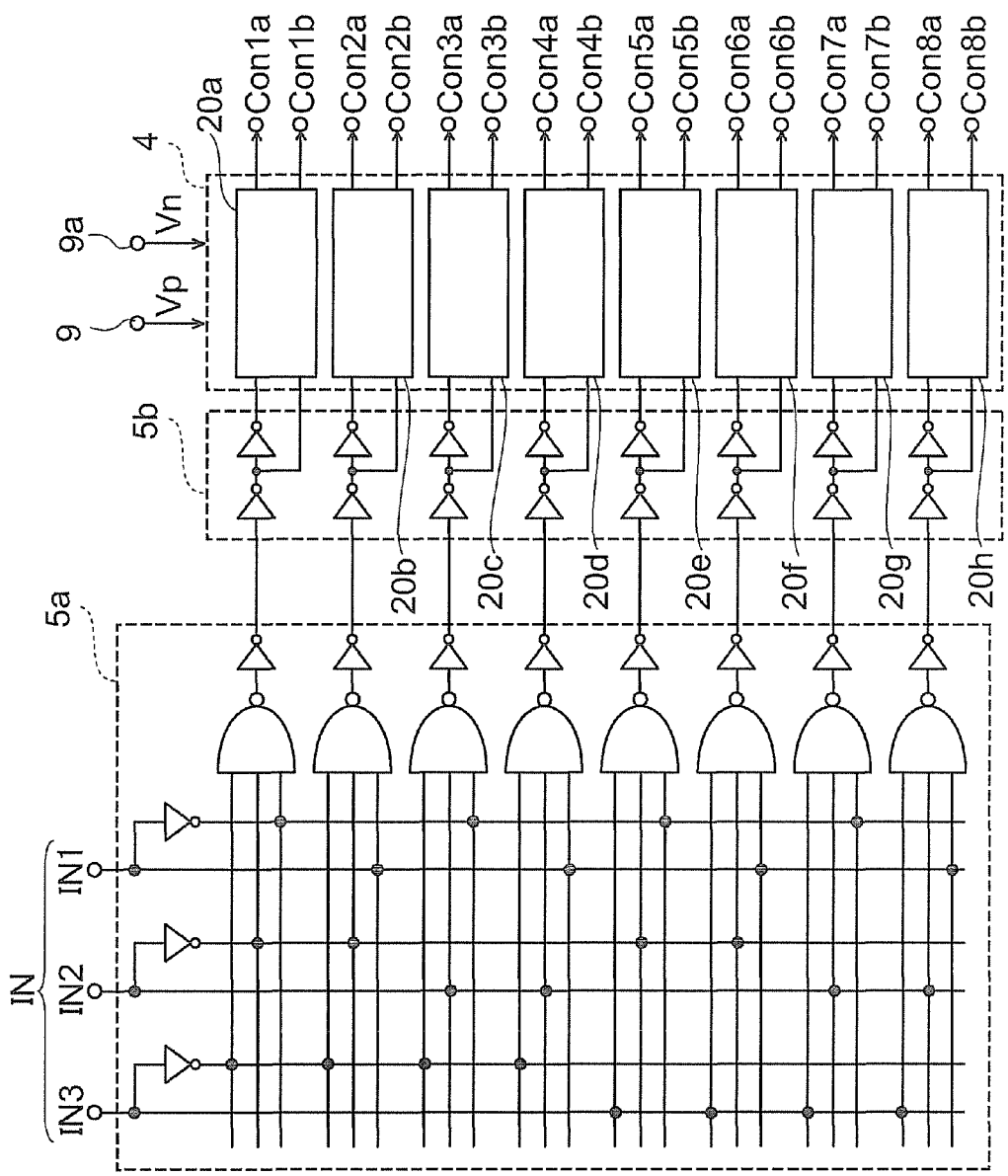
FIG. 3 is a circuit diagram illustrating the configuration of a decoder and a driver of the semiconductor switch illustrated in FIG. 1.

FIG. 3 is a circuit diagram illustrating the configuration of the decoder and the driver of the semiconductor switch illustrated in FIG. 1.

As illustrated in FIG. 3, the terminal switch signal is decoded by a decoder 5a and controls the driver 4 via an inverting and non-inverting signal generator 5b. A SP8T switch unit 2 is provided in the semiconductor switch 1. Therefore, the decoder 5a decodes a 3-bit terminal switch signal.

In other words, the decoder 5a decodes the terminal switch signal input to the terminal IN, which includes three terminals IN1 to IN3, and outputs the result as an 8-bit decoded signal. Then, the decoded signal controls the driver 4 via the inverting and non-inverting signal generator 5b.

The decoder 5a is unnecessary in the case where the terminal switch signal is input as the decoded signal or in the case where the number of terminals of the switch unit 2 is 2.

The driver 4 has a configuration in which eight level shifters 20a to 20h are disposed. The driver 4 includes a high potential terminal 9 and a low potential terminal 9a. A positive second potential Vp, which is a power supply voltage Vdd or is higher than the power supply voltage Vdd, is supplied to the high potential terminal 9. As illustrated in FIG. 1, the high potential terminal 9 of the driver 4 is connected to the power supply terminal 8; and the power supply voltage Vdd is supplied as the second potential Vp. A negative first potential Vn is supplied to the low potential terminal 9a.

The inverting and non-inverting signal generator 5b is provided between the decoder 5a and the driver 4 because the level shifters 20a to 20h are differential circuits. The power supply voltage Vdd is provided to the other circuit units, e.g., the decoder 5a of the prior stage of the driver 4, etc.

Figure 4:
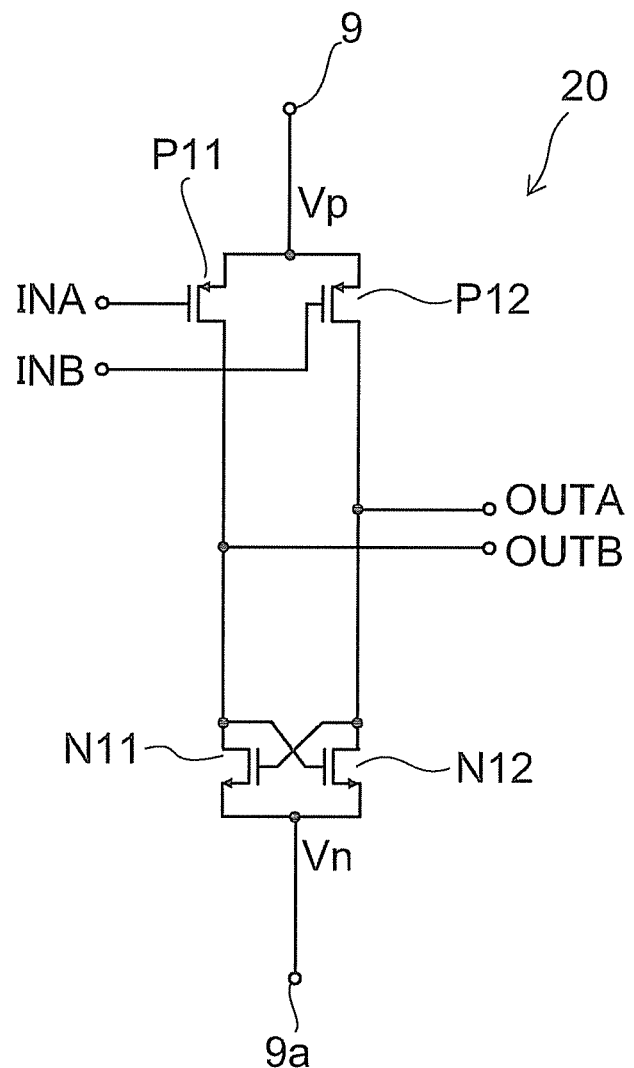
FIG. 4 is a circuit diagram illustrating the configuration of a level shifter.

FIG. 4 is a circuit diagram illustrating the configuration of a level shifter.

FIG. 4 is a circuit diagram of a level shifter 20 included in the driver 4.

The driver 4 includes the level shifters 20a to 20h which have the same configuration as the level shifter 20.

The level shifter 20 includes a pair of N-channel MOSFETs (hereinbelow, NMOSs) N11 and N12 and a pair of P-channel MOSFETs (hereinbelow, PMOSs) P11 and P12.

The source of each of the NMOSs N11 and N12 are connected to the low potential terminal 9a. The gate of NMOS N11 is connected to the drain of the NMOS N12. The gate of the NMOS N12 is connected to the drain of the NMOS N11.

The drain of the NMOS N11 is connected to the drain of the PMOS P11; and these are connected to an output terminal OUTB, which is one of the differential outputs of the level shifter 20. The drain of the NMOS N12 is connected to the drain of the PMOS P12; and these are connected to an output terminal OUTA, which is one other differential output of the level shifter 20. The positive second potential Vp is supplied to the source of each of the PMOSs P11 and P12 via the high potential terminal 9. The gates of the PMOSs P11 and P12 are connected to the not-illustrated decoder of the prior stage via input terminals INA and INB, respectively.

The ON potential Von and the OFF potential Voff described above are supplied to the gates of the through FETs and the shunt FETs of the switch unit 2 illustrated in FIG. 2 via the output terminals OUTA and OUTB.

The input levels of the differential inputs INA and INB of the level shifter 20 have, for example, a high level of 2.4 V and a low level of 0 V and are supplied from a not-illustrated decoder of the prior stage. For example, 2.4 V is supplied to the high potential terminal 9 as the second potential Vp. For example, −1.5 V is supplied to the low potential terminal 9a as the negative first potential Vn.

In the case where, for example, the differential input INA is the low level (0 V) and the differential input INB is the high level (2.4 V), the potential of the output terminal OUTB is 2.4 V which is equal to the second potential Vp; and the potential of the output terminal OUTA is −1.5 V which is equal to the first potential Vn. Accordingly, the level shifter 20 can drive the switch unit 2 by supplying 2.4 V as the ON potential Von and −1.5 V as the OFF potential Voff to the gates of the through FETs and the shunt FETs of the switch unit 2 illustrated in FIG. 2.

In other words, the level shifter 20 is input the differential input signal in which the high level is the power supply voltage Vdd and the low level is 0 V and outputs the differential signal in which the high level is the second potential Vp and the low level is the first potential Vn. The level shifter 20 converts the potential of the low level into the first potential Vn and converts the potential of the high level into the second potential Vp.

Figure 5:
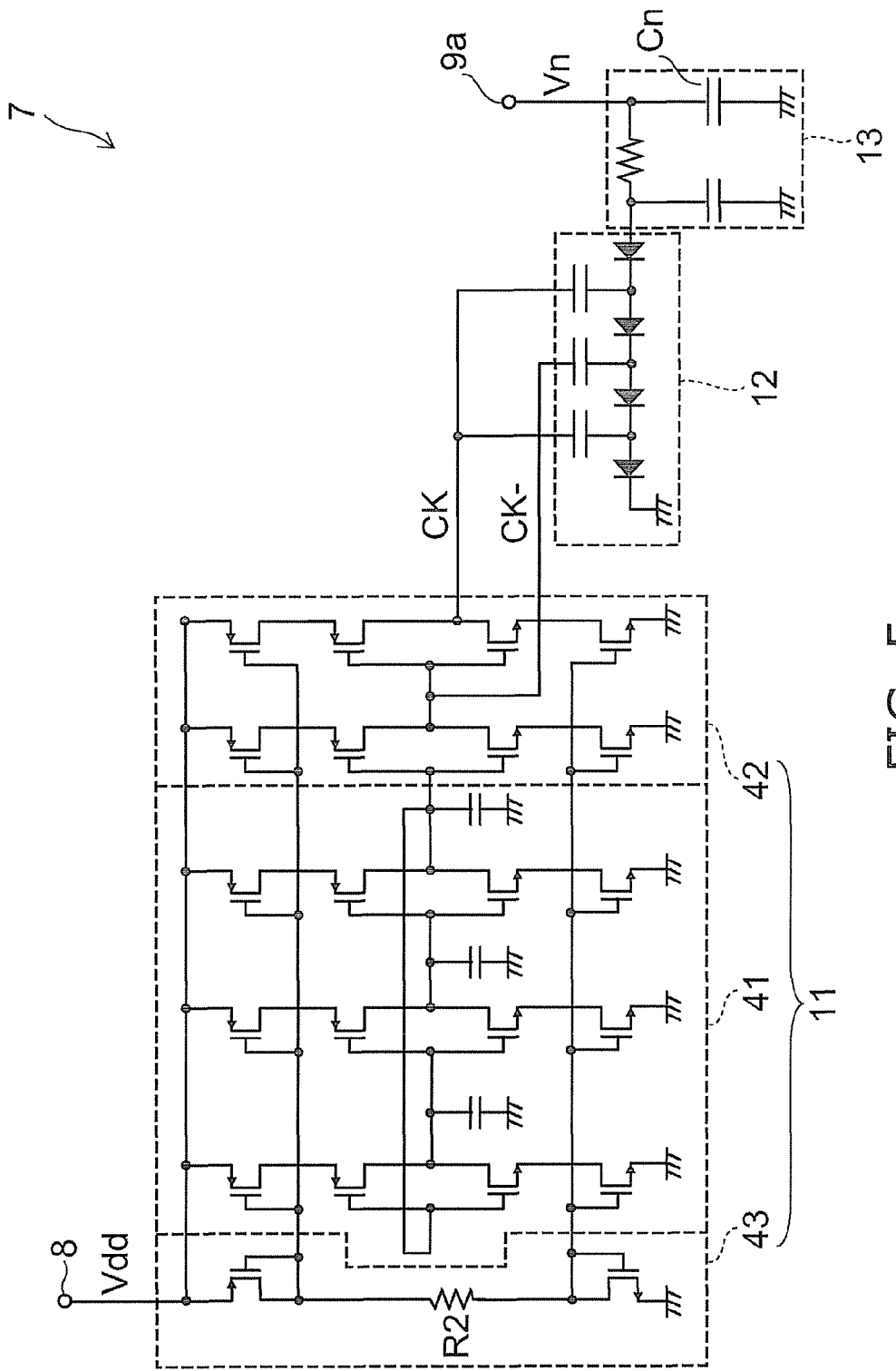
FIG. 5 is a circuit diagram illustrating the configuration of a voltage generator of the semiconductor switch illustrated in FIG. 1.

FIG. 5 is a circuit diagram illustrating the configuration of the voltage generator of the semiconductor switch illustrated in FIG. 1.

As illustrated in FIG. 5, the voltage generator 7 includes an oscillator 11, a charge pump 12, and a low-pass filter 13.

The oscillator 11 includes a ring oscillator 41 including an odd number of stages of inverters, an output buffer 42, and a bias circuit 43 and outputs differential clocks CK and CK−.

The bias circuit 43 includes a resistor R2 and supplies a bias to the ring oscillator 41 and the output buffer 42.

The charge pump 12 includes multiple diodes connected in series and multiple capacitors, where each of the capacitors has one terminal connected between each of the diodes. The cathode side of the multiple diodes connected in series is connected to the ground; and the anode side is connected to the low-pass filter 13. The differential clocks CK and CK−, which are the outputs of the oscillator 11, are supplied alternately to the other terminals of the capacitors.

A negative voltage is generated in the charge pump 12 by the storage and movement of charge due to the differential clocks CK and CK−.

The low-pass filter 13 includes a resistor and capacitors. The output of the charge pump 12 is smoothed and output to the low potential terminal 9a. The terminal voltage of an output capacitor Cn of the low-pass filter 13 connected to the low potential terminal 9a is the first potential Vn.

Although the voltage generator 7 generating the negative first potential Vn is described, another charge pump may be provided similarly to generate the positive second potential Vp.

Figure 6:
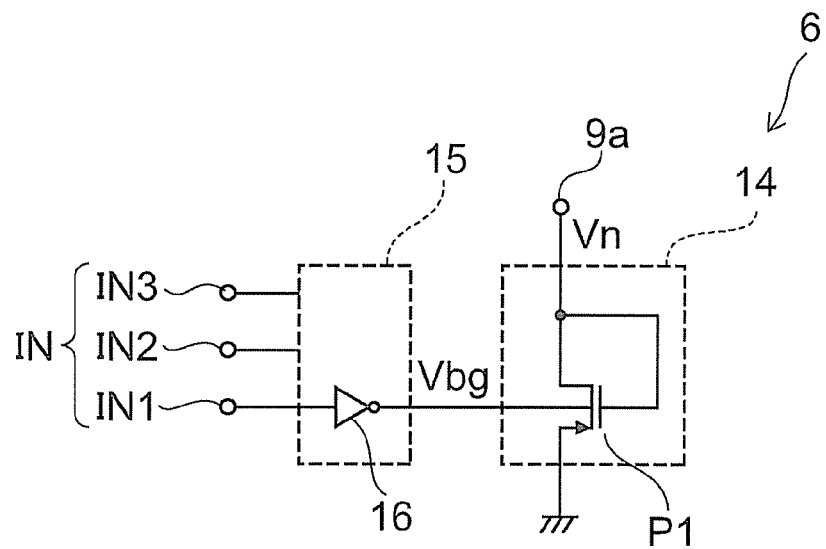
FIG. 6 is a circuit diagram illustrating the configuration of a voltage controller of the semiconductor switch illustrated in FIG. 1.

FIG. 6 is a circuit diagram illustrating the configuration of the voltage controller of the semiconductor switch illustrated in FIG. 1.

As illustrated in FIG. 6, the voltage controller 6 includes a clamper 14 and a clamp signal generator 15.

The clamper 14 includes a first transistor P1.

The first transistor P1 is connected between the low potential terminal 9a and the ground. In other words, the drain of the first transistor P1 is connected to the low potential terminal 9a and the source is connected to the ground. The gate of the first transistor P1 is connected to the drain. The back gate, i.e., the body region, of the first transistor P1 is connected to the output of the clamp signal generator 15. A back gate potential Vbg of the first transistor P1 is controlled by the clamp signal generator 15.

The clamper 14 is a circuit that clamps the voltage between the low potential terminal 9a and the ground, i.e., the first potential Vn. The clamping voltage of the clamper 14 is controlled by the output of the clamp signal generator 15.

In the voltage controller 6 illustrated in FIG. 6, the clamper 14 includes a PMOS first transistor P1. However, the clamper 14 may include any number of PMOSs not less than 1.

The clamp signal generator 15 includes an inverter (INV) 16. The clamp signal generator 15 generates the clamp signal from the terminal switch signal input to the terminal IN to control the clamper 14.

The terminal IN1 is connected to the input of the INV 16; and the output of the INV 16 is output to the clamper 14 as the clamp signal.

As recited above, high frequency signals having high power levels such as the GSM standard may be input to the odd-numbered high frequency terminals RF1, RF3, RF5, and RF7 of the switch unit 2; and high frequency signals having low power levels such as the UMTS standard may be input to the even-numbered high frequency terminals RF2, RF4, RF6, and RF8.

Accordingly, of the 3-bit terminal IN including the terminals IN1 to IN3, only the signal of the terminal IN1 is decoded to generate the clamp signal. The clamp signal of the high level or the low level is output according to the low level or the high level of the least significant bit (LSB) of the terminal switch signal input to the terminal IN.

Thus, the clamp signal generator 15 generates the clamp signal according to the terminal switch signal to control the clamper 14.

The clamp signal generator 15 illustrated in FIG. 6 generates the clamp signal by decoding the signal of the terminal IN1. However, the clamp signal generator 15 is a circuit that generates the clamp signal according to the terminal switch signal and may have a configuration in which the desired clamp signal is generated from the terminal switch signal input to the terminals IN1 to IN3.

Figure 7:
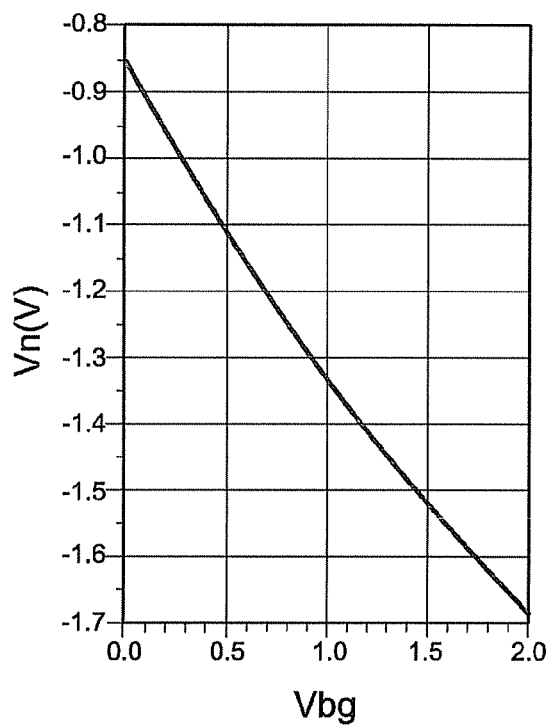
FIG. 7 is a schematic view illustrating the back gate potential Vbg dependency of a clamping voltage.

FIG. 7 is a schematic view illustrating the back gate potential Vbg dependency of the clamping voltage.

FIG. 7 illustrates the simulation results of the back gate potential Vbg dependency of the clamping voltage of the first transistor P1, i.e., the first potential Vn.

The first potential Vn decreases monotonously as the back gate potential Vbg increases. For example, when the back gate potential Vbg is 0 V, the first potential Vn is about −0.95 V. As the back gate potential Vbg increases to 2.0 V, the first potential Vn decreases (the absolute value increases) to about −1.68 V.

Accordingly, the clamping voltage, i.e., the first potential Vn, decreases in the case where the LSB of the terminal switch signal input to the terminal IN is the low level and increases in the case where the LSB is the high level.

In the semiconductor switch 1, the voltage controller 6 can control the first potential Vn according to the terminal switch signal. Thereby, as described below, the OFF distortion can be reduced.

The configuration of the semiconductor switch according to the embodiment was constructed based on a phenomenon newly discovered by the experimental results described below.

The inventor changed a power level Pin of the high frequency signal passing through the switch unit of the semiconductor switch and studied in detail the effects of the first potential Vn on the third harmonic radiated from the antenna terminal ANT. The third-order intermodulation distortion of the OFF distortion, which is difficult to remove by filtering, is important. Therefore, the third harmonic was investigated.

FIG. 8 is a schematic view illustrating the first potential Vn dependency of the third harmonic.

FIG. 8 illustrates the first potential Vn dependency of the third harmonic radiated from the antenna terminal ANT in the case where the power level Pin of the high frequency signal passing through the switch unit 2 is 37 dBm.

As illustrated in FIG. 8, the third harmonic decreases drastically as the first potential Vn is reduced from 0 V and has a minimum near where the first potential Vn=−1.4 V. Conversely, the third harmonic increases as the first potential Vn is reduced further. In other words, for a constant power level Pin, a first potential Vn exists at which the third-order distortion is a minimum.

FIG. 9 is a schematic view illustrating the first potential Vn dependency of the third harmonic at various power levels Pin.

As illustrated in FIG. 9, the first potential Vn at which the third harmonic is a minimum shifts upward as the power level Pin is reduced. Based on such results, the first potential Vn at which the third harmonic is a minimum was determined for the power levels Pin. As a result, it was shown that applying a first potential Vn that is 0.7 V lower than the voltage swing of the input power as the OFF potential Voff to the FETs provided in the SOI substrate results in the lowest third harmonic generated by the FETs.

FIG. 10 is a schematic view illustrating the power level Pin dependency of the first potential Vn minimizing the third harmonic.

In FIG. 10, the solid line illustrates the calculated values of the first potential Vn at which the third harmonic is a minimum and the xs illustrate the actual measured values. The actual measured values match the calculated values extremely well.

Based on such results, the optimal first potentials Vn for the GSM standard and the UMTS standard, i.e., Vn_GSM and Vn_UMTS, can be determined as follows.

GSM standard: Vn_GSM=−1.2 to −1.5 V
UMTS standard: Vn_UMTS=−0.8 to −0.9 V

The value of the optimal first potential Vn differs greatly with the power level Pin passing through the switch unit 2.

For example, when the optimal first potential Vn of Vn_GSM for the power level Pin used for the GSM standard (33 to 38 dBm) is applied as the OFF potential Voff to the FETs of the switch unit 2, the third harmonic occurring at the power levels used for the UMTS standard (20 to 27 dBm) undesirably increases. When the same first potential Vn is applied as the OFF potential Voff to the FETs, it is difficult to satisfy the distortion criteria of both the GSM standard and the UMTS standard. The numerical examples of the power levels Pin recited above are the design values of the semiconductor switch based on each communication standard.

Conversely, in the semiconductor switch 1, the voltage controller 6 controls the first potential Vn to be the optimal value according to the standard used for each of the high frequency terminals RF1 to RF8. For example, high frequency signals having high power levels such as the GSM standard may be input to the odd-numbered high frequency terminals RF1, RF3, RF5, and RF7. High frequency signals having low power levels such as the UMTS standard may be input to the even-numbered high frequency terminals RF2, RF4, RF6, and RF8.

Accordingly, in the case where the GSM standard is selected, the antenna terminal ANT and each of the ports of the odd-numbered high frequency terminals RF1, RF3, RF5, and RF7 are in the conducting state and the LSB of the terminal switch signal input to the terminal IN is the low level. In the case where the UMTS standard is selected, the antenna terminal ANT and each of the ports of the even-numbered high frequency terminals RF2, RF4, RF6, and RF8 are in the conducting state and the LSB of the terminal switch signal input to the terminal IN is the high level.

The clamp signal generator 15 of the voltage controller 6 switches the clamp signal to the high level when the LSB of the terminal switch signal is the low level. When the LSB is the high level, the clamp signal is switched to the low level. Therefore, the clamper 14 causes the first potential Vn to decrease when the LSB of the terminal switch signal is the low level and increase when the LSB is the high level.

The potentials of the high level and the low level of the clamp signal can be set such that the first potential Vn clamped by the clamper 14 becomes the optimal value. For example, in the case where the low level is set to 0.1 V and the high level is set to 1.5 V, the first potential Vn is clamped to −0.9 V (Vn_UMTS) and −1.5 V (Vn_GSM), respectively, as illustrated in FIG. 7.

When the high frequency terminals RF2, RF4, RF6, and RF8 used for the UMTS standard are selected, the first potential Vn of Vn_UMTS which is optimal for the UMTS standard is applied as the OFF potential Voff to the FETs of the switch unit 2. When the high frequency terminals RF1, RF3, RF5, and RF7 used for the GSM standard are selected, the first potential Vn of Vn_GSM which is optimal for the GSM standard is applied.

Accordingly, the OFF distortion for both the UMTS standard and the GSM standard can be reduced without changing the size and layout of the FETs of the switch unit 2.

Thus, according to the semiconductor switch 1, the OFF distortion can be reduced by controlling the first potential Vn according to the terminal switch signal input from the outside.

In the semiconductor switch 1, a configuration is illustrated in which the two standards of the high frequency signal having a high power level such as the GSM standard and the high frequency signal having a low power level such as the UMTS standard are used. However, applications are possible in any number of communication standards not less than 2 using a similar configuration. Although configurations are described in the embodiments hereinbelow in which the two standards of the GSM standard and the UMTS standard are used, applications are similarly possible in any number of communication standards not less than 2.

The semiconductor switch 1 switches between the GSM standard and the UMTS standard using the LSB of the terminal switch signal. However, as long as the communication standard used by each of the high frequency terminals RF1 to RF8 of the switch unit 2 is determined beforehand, control is possible of the optimal first potential Vn for each of the standards by changing the configuration of the clamp signal generator 15 of the voltage controller 6. Then, the OFF distortion can be reduced.

For example, in the case where a high frequency signal of the UMTS standard is input to the high frequency terminals RF1 and RF2 and a high frequency signal of the GSM standard is input to the high frequency terminals RF3 to RF8, the voltage controller may have a configuration similar to that recited above.

Figure 11:
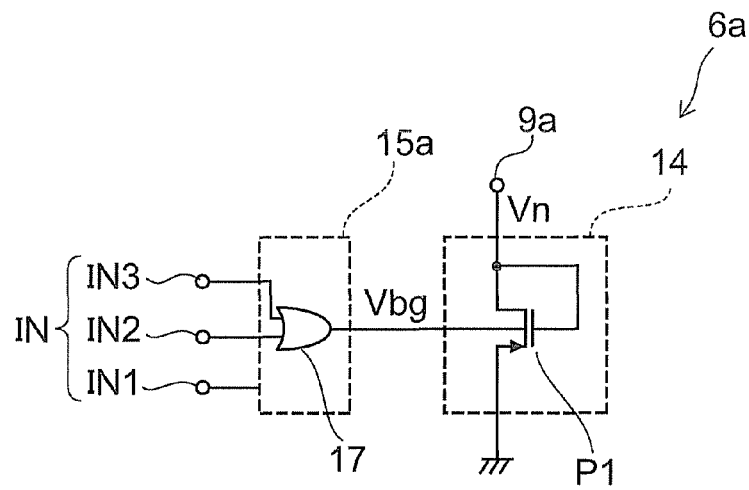
FIG. 11 is a circuit diagram illustrating another configuration of the voltage controller.

FIG. 11 is a circuit diagram illustrating another configuration of the voltage controller.

FIG. 11 illustrates the configuration of the voltage controller in the case where a high frequency signal of the UMTS standard is input to the high frequency terminals RF1 and RF2 and a high frequency signal of the GSM standard is input to the high frequency terminals RF3 to RF8.

As illustrated in FIG. 11, the voltage controller 6a includes the clamper 14 and a clamp signal generator 15a.

The voltage controller 6a has a configuration in which the clamp signal generator 15 of the voltage controller 6 illustrated in FIG. 6 is replaced with the clamp signal generator 15a. The clamper 14 is similar to the clamper 14 illustrated in FIG. 6.

The clamp signal generator 15a includes an OR circuit (OR) 17.

The clamp signal generator 15a generates a clamp signal from the terminal switch signal input to the terminal IN to control the clamper 14.

The input of the OR 17 is connected to the terminals IN2 and IN3. The output of the OR 17 controls the back gate potential Vbg of the first transistor P1 of the clamper 14 as the clamp signal.

When the two bits on the MSB side of the terminal switch signal input to the terminal IN are the low level, the clamp signal is switched to the low level (e.g., 0.1 V). When at least one of the two bits on the MSB side is the high level, the clamp signal is switched to the high level (e.g., 1.5 V).

Accordingly, when the high frequency terminals RF1 and RF2 of the switch unit 2 are selected, the clamp signal is switched to the low level and the first potential Vn becomes Vn_UMTS (e.g., −0.9 V) which is optimal for the UMTS standard. When the high frequency terminals RF3 to RF8 are selected, the clamp signal is switched to the high level and the first potential Vn becomes Vn_GSM (e.g., −1.5 V) which is optimal for the GSM standard.

As illustrated in FIG. 11, the clamp signal generator 15a generates the clamp signal from the terminal switch signal input to the terminal IN to control the clamper 14.

However, in the case where the semiconductor switch 1 includes the decoder 5 as illustrated in FIG. 1, the clamp signal generator 15a also can generate the clamp signal from the output of the decoder 5.

Figure 12:
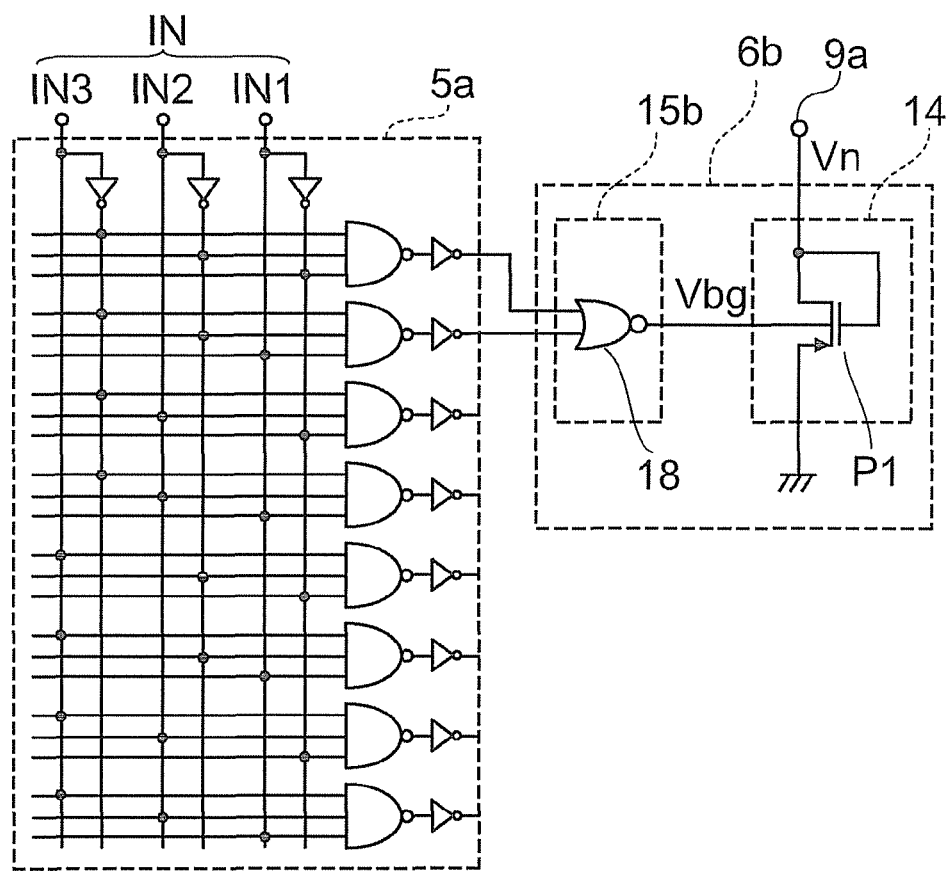
FIG. 12 is a circuit diagram illustrating another configuration of the decoder and the voltage controller.

FIG. 12 is a circuit diagram illustrating another configuration of the decoder and the voltage controller.

FIG. 12 illustrates another configuration of the voltage controller in the case where a high frequency signal of the UMTS standard is input to the high frequency terminals RF1 and RF2 and a high frequency signal of the GSM standard is input to the high frequency terminals RF3 to RF8.

As illustrated in FIG. 12, the terminal switch signal input to the terminal IN is input to the voltage controller 6b via the decoder 5a.

The voltage controller 6b has a configuration in which the clamp signal generator 15a of the voltage controller 6a illustrated in FIG. 11 is replaced with a clamp signal generator 15b. The clamper 14 is similar to the clamper 14 illustrated in FIG. 6.

The voltage controller 6b includes the clamper 14 and the clamp signal generator 15b.

The clamp signal generator 15b includes an OR inversion circuit (NOR) 18. The two bits on the LSB side of the output of the decoder 5a are input to the NOR 18. Other circuits around the decoder 5a such as the inverting and non-inverting signal generator 5b are not illustrated.

The outputs of the two bits on the LSB side of the decoder 5a are switched to the high level when the high frequency terminals RF1 and RF2 are selected by the terminal switch signal. Both are switched to the low level when the other high frequency terminals RF3 to RF8 are selected. Accordingly, the output of the NOR 18 is switched to the low level (e.g., 0.1 V) when the high frequency terminals RF1 and RF2 are selected and the high level (e.g., 1.5 V) when the other high frequency terminals RF3 to RF8 are selected. The output of the NOR 18 controls the back gate potential Vbg of the first transistor P1 of the clamper 14 as the clamp signal.

Accordingly, the clamp signal is switched to the low level and the first potential Vn becomes Vn_UMTS (e.g., −0.9 V)

which is optimal for the UMTS standard when the high frequency terminals RF1 and RF2 are selected. When the high frequency terminals RF3 to RF8 are selected, the clamp signal is switched to the high level and the first potential Vn becomes Vn_GSM (e.g., −1.5 V) which is optimal for the GSM standard.

Thus, according to the voltage controller 6b as well, similarly to the voltage controller 6a illustrated in FIG. 11, the OFF distortion for both the UMTS standard and the GSM standard can be reduced without changing the size and layout of the FETs of the switch unit 2.

In the voltage controllers 6, 6a, and 6b recited above, a configuration is illustrated for the case where the communication standards used by the high frequency terminals RF1 to RF8 are determined beforehand. In other words, the clamp signal is generated from the terminal switch signal by a predetermined logic.

However, in some cases, the communication standards used by the high frequency terminals RF1 to RF8 may not be pre-determined. For example, there are cases where a communication standard is allotted to each of the high frequency terminals RF1 to RF8 after the semiconductor switch is constructed.

Figure 13:
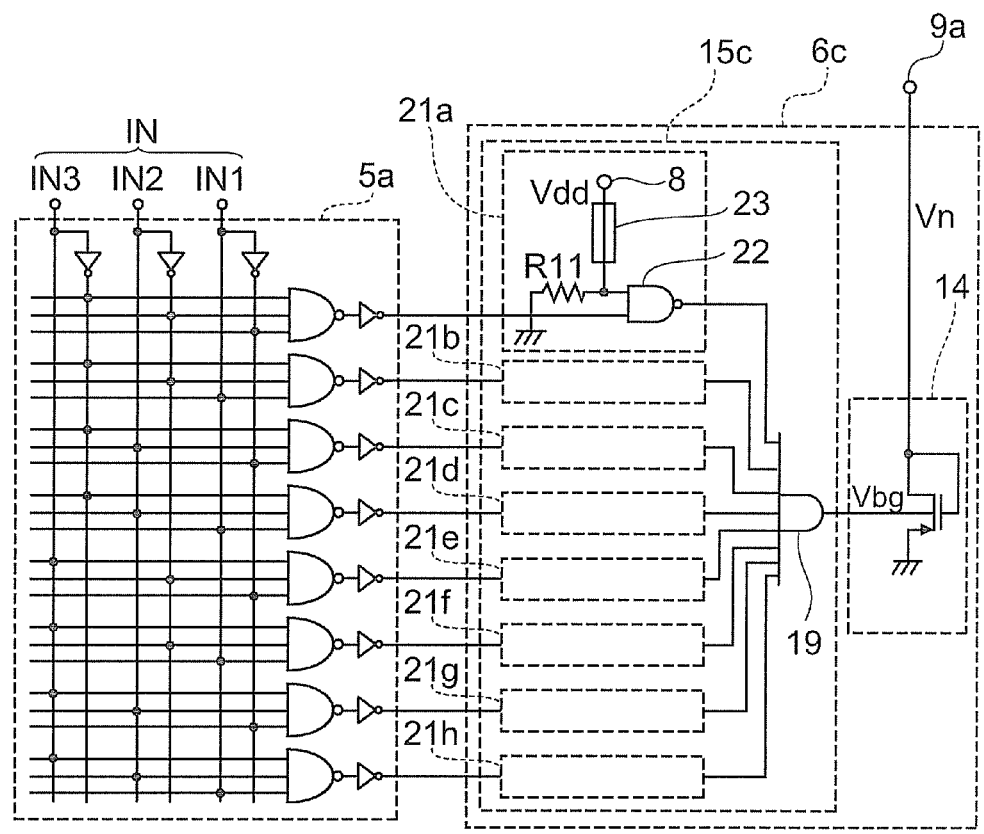
FIG. 13 is a circuit diagram illustrating another configuration of the decoder and the voltage controller.

FIG. 13 is a circuit diagram illustrating another configuration of the decoder and the voltage controller.

FIG. 13 illustrates the configuration of the voltage controller in the case where the communication standard used by each of the high frequency terminals RF1 to RF8 is not allotted beforehand.

As illustrated in FIG. 13, the voltage controller 6c has a configuration in which the clamp signal generator 15b of the voltage controller 6b illustrated in FIG. 12 is replaced with a clamp signal generator 15c. The clamper 14 is similar to the clamper 14 illustrated in FIG. 6. The decoder 5a is similar to the decoder 5a illustrated in FIG. 12.

The terminal switch signal input to the terminal IN is input to the voltage controller 6c via the decoder 5a.

The voltage controller 6c includes the clamper 14 and the clamp signal generator 15c.

The clamp signal generator 15c includes an AND circuit (AND) 19 and fuse circuits 21a to 21h. The bits of the output of the decoder 5a are input to the fuse circuits 21a to 21h, respectively. Other circuits around the decoder 5a such as the inverting and non-inverting signal generator 5b are not illustrated.

The fuse circuit 21a includes an AND inversion circuit (NAND) 22 having two input terminals, a fuse 23, and a resistor R11

The LSB of the output of the decoder 5a is input to one of the input terminals of the NAND 22. One other input terminal of the NAND 22 is connected to the power supply terminal 8 via the fuse 23, is supplied with the power supply voltage Vdd, and is connected to the ground via the resistor R11.

The fuse 23 has a configuration in which the fuse 23 is breakable after the semiconductor switch including the voltage controller 6c is constructed. The resistance value of the fuse 23 is sufficiently less than the resistance value of the resistor R11; and the resistance value of the fuse 23 after being broken is sufficiently greater than the resistance value of the resistor R11.

In the case where the fuse 23 is in the conducting state, the potential of the one other input terminal of the NAND 22 is the high level. In the case where the fuse 23 is broken, the potential of the one other input terminal of the NAND 22 is the low level.

The output of the NAND 22, i.e., the output of the fuse circuit 21a, is input to the AND 19.

When the input of the fuse circuit 21a is the low level, the output of the NAND 22 is the high level. When the input of the fuse circuit 21a is the high level, the output of the NAND 22 is the low level when the fuse 23 is in the conducting state and the high level when the fuse 23 is broken.

In other words, the output of the fuse circuit 21a is the low level only in the case where the fuse 23 is in the conducting state and the high level is input. In the case where the fuse 23 is broken, the output of the decoder 5a is masked and the output of the fuse circuit 21a is the high level.

The fuse circuits 21b to 21h have configurations similar to that of the fuse circuit 21a and receive inputs of the bits of the output of the decoder 5a. The outputs of the fuse circuits 21b to 21h are input to the AND 19.

Each of the bits of the output of the decoder 5a is switched to the high level when each of the respective high frequency terminals RF1 to RF8 is selected by the terminal switch signal. The bit corresponding to each of the unselected terminals of the high frequency terminals RF1 to RF8 is the low level Accordingly, the output of the AND 19 is switched to the low level (e.g., 0.1 V) when a high frequency terminal corresponding to a fuse circuit of the fuse circuits 21a to 21h in which the fuse 23 is in the conducting state is selected. In the case where another high frequency terminal corresponding to a fuse circuit of the fuse circuits 21a to 21h in which the fuse 23 is broken is selected, the output is switched to the high level (e.g., 1.5 V). The output of the AND 19 controls the back gate potential Vbg of the first transistor P1 of the clamper 14 as the clamp signal.

Here, the fuses 23 of the fuse circuits 21a to 21h connected to the bits output from the decoder 5a at the high level when the ports used for the GSM standard are in the conducting state are broken. For example, in the case where the high frequency terminal RF1 is used for the GSM standard, the fuse 23 of the fuse circuit 21a is broken.

Thereby, when the port used for the GSM standard is in the conducting state, the clamp signal is switched to the high level and the first potential Vn of Vn_GSM (e.g., −1.5 V) is applied. When the port used for the UMTS standard is in the conducting state, the clamp signal is switched to the low level and the first potential Vn of Vn_UMTS (e.g., −0.9 V) is applied to the FETs as the OFF potential Voff of the switch unit 2.

Thus, according to the voltage controller 6c as well, similarly to the voltage controller 6a illustrated in FIG. 11, the OFF distortion for both the UMTS standard and the GSM standard can be reduced without changing the size and layout of the FETs of the switch unit 2.

Further, according to the voltage controller 6c, any of the high frequency terminals can be selectively selected and programmed to be used for the GSM standard or for the UMTS standard even after the semiconductor switch is constructed by subsequently breaking the fuse 23 of the fuse circuits 21a to 21h. Therefore, the degrees of freedom of the layout when embedding the semiconductor switch into a module and the like drastically increases.

However, in the voltage controllers 6 to 6c recited above, the clamp signal is generated according to the terminal switch signal to control the clamper 14. However, the first potential Vn also can be controlled by the output current of the oscillator of the voltage generator.

Figure 14:
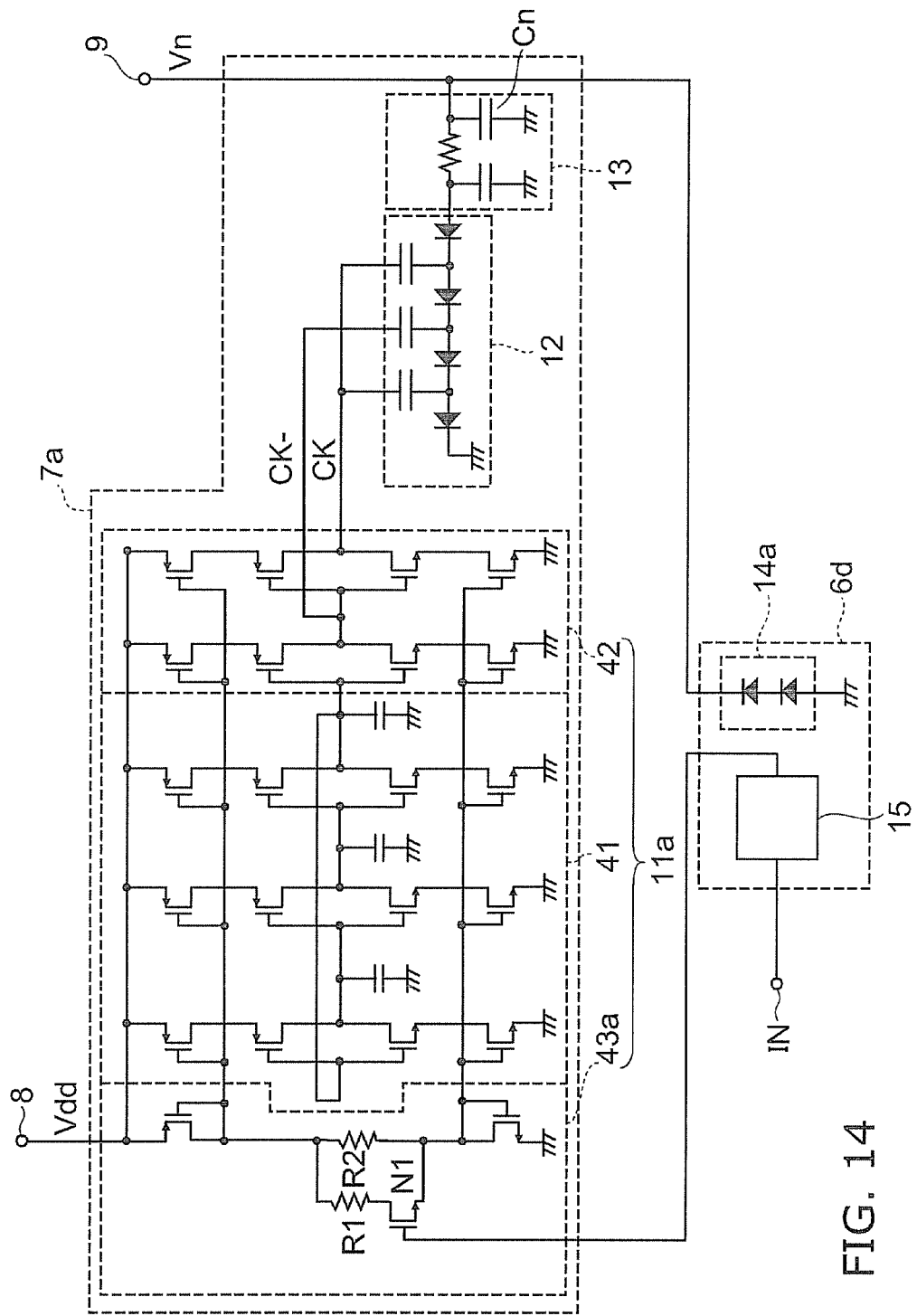
FIG. 14 is a circuit diagram illustrating another configuration of the voltage controller and the voltage generator.

FIG. 14 is a circuit diagram illustrating another configuration of the voltage controller and the voltage generator.

As illustrated in FIG. 14, the voltage controller 6d includes a clamper 14a and the clamp signal generator 15. A voltage generator 7a includes an oscillator 11a, the charge pump 12, and the low-pass filter 13.

The voltage controller 6d has a configuration in which the clamper 14 of the voltage controller 6 illustrated in FIG. 6 is replaced with the clamper 14a. The clamp signal generator 15 is similar to the clamp signal generator 15 of FIG. 6 and outputs the clamp signal according to the terminal switch signal input to the terminal IN.

In other words, the clamp signal generator 15 outputs the low level as the clamp signal when the high frequency terminals RF2, RF4, RF6, and RF8 used for the UMTS standard are selected. When the high frequency terminals RF1, RF3, RF5, and RF7 used for the GSM standard are selected, the high level is output.

The clamper 14a is connected between the low potential terminal 9a and the ground. The clamper 14a includes diodes to clamp the first potential Vn of the low potential terminal 9a. The diodes may include, for example, transistors having diode-like connections, etc.

Due to the forward-direction characteristics of the diodes, the clamping voltage, i.e., the first potential Vn, decreases as the current flowing in the clamper 14a increases.

The voltage generator 7a includes the oscillator 11a, the charge pump 12, and the low-pass filter 13.

The voltage generator 7a has a configuration in which the oscillator 11 of the voltage generator 7 illustrated in FIG. 5 is replaced with the oscillator 11a. The charge pump 12 and the low-pass filter 13 are similar to those of the voltage generator 7 of FIG. 5.

The oscillator 11a includes the ring oscillator 41, the output buffer 42, and a bias circuit 43a.

The oscillator 11a has a configuration in which the bias circuit 43 of the oscillator 11 illustrated in FIG. 5 is replaced with the bias circuit 43a to output the differential clocks CK and CK–. The bias circuit 43a has a configuration in which a resistor R1 and an NMOS N1 are added to the bias circuit 43.

The ring oscillator 41 includes three stages of CMOS inverters of the current mirror load. A capacitor is connected between the ground and the connection between each of the stages of the CMOS inverters to increase the delay time. The output of the ring oscillator 41 is input to the output buffer 42 having two stages of CMOS inverters of the current mirror load. The differential clocks CK and CK– are output from the output buffer 42.

The resistor R2 is inserted into the reference side of the current mirror. The NMOS N1 and the resistor R1 are connected in series to the two terminals of the resistor R2. The clamp signal from the voltage controller 6d is input to the gate of the NMOS N1.

The current of the current mirror is controlled by the resistors R1 and R2. The output current of the oscillator 11a is controlled by the current of the current mirror. Accordingly, the output current of the oscillator 11a is controlled by the resistors R1 and R2.

Here, the resistors R1 and R2 of the current mirror have the relationship of R1<R2; and the ON resistance of the NMOS N1 is sufficiently low compared to the resistor R1.

When the clamp signal is the low level, the NMOS N1 is switched to the OFF state, and the output current of the oscillator 11a is controlled by the resistor R2. When the clamp signal is the high level, the NMOS N1 is switched to the ON state, and the output current of the oscillator 11a becomes a current controlled by the parallel connection of the resistors R1 and R2.

Accordingly, the output current of the charge pump 12 and the low-pass filter 13 decreases when the clamp signal is the low level and increases when the clamp signal is the high level When the clamp signal is the low level, the clamping voltage, i.e., the first potential Vn, decreases because the current flowing through the clamper 14a decreases. When the clamp signal is the high level, the first potential Vn increases because the current flowing through the clamper 14a increases.

The potentials of the high level and the low level of the clamp signal can be set such that the first potential Vn clamped by the clamper 14a has the optimal value.

Thus, the first potential Vn can be controlled by controlling the current flowing through the clamper 14a according to the terminal switch signal.

According to the voltage controller 6d and the voltage generator 7a as well, the OFF distortion in both standards having different power levels such as, for example, the UMTS standard and the GSM standard can be reduced without changing the size and layout of the FETs of the switch unit 2.

Figure 15:
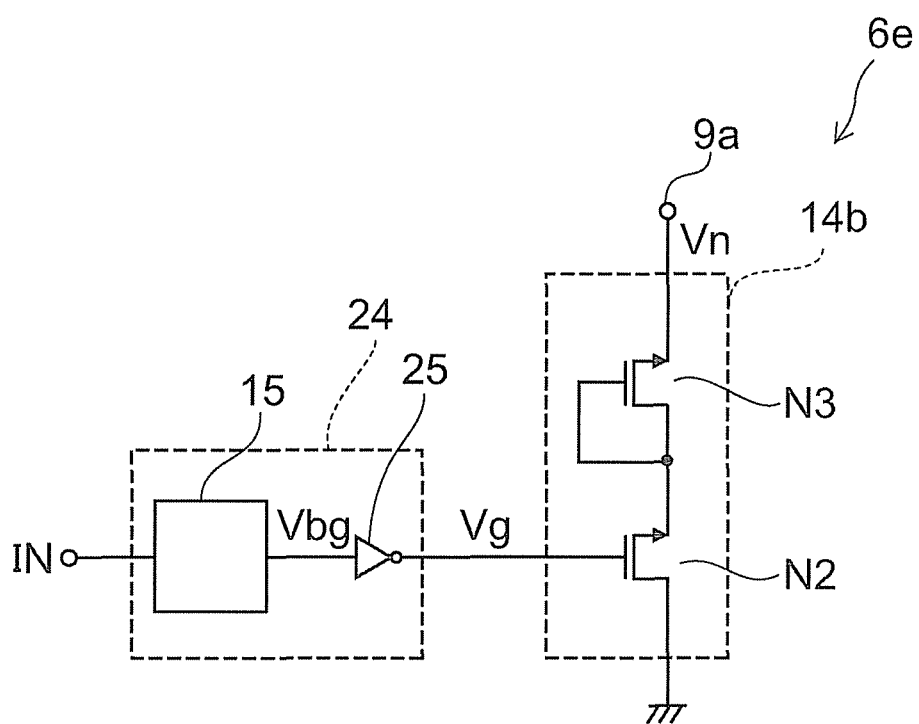
FIG. 15 is a circuit diagram illustrating another configuration of the voltage controller.

FIG. 15 is a circuit diagram illustrating another configuration of the voltage controller.

As illustrated in FIG. 15, the voltage controller 6e includes a clamper 14b and a clamp signal generator 24. The voltage controller 6e has a configuration in which the clamper 14 and the clamp signal generator 15 of the voltage controller 6 illustrated in FIG. 6 are replaced with the clamper 14b and the clamp signal generator 24, respectively.

The clamp signal generator 24 is a circuit that outputs the clamp signal according to the terminal switch signal input to the terminal IN. Herein, the case where the terminal switch signal selects the high frequency terminal to which a high frequency signal having a low power level such as, for example, the UMTS standard is input is referred to as the UMTS mode. The case where the terminal switch signal selects the high frequency terminal to which a high frequency signal having a high power level such as, for example, the GSM standard is input is referred to as the GSM mode.

The clamp signal generator 24 outputs the high level in the UMTS mode and outputs the low level in the GSM mode.

The clamp signal generator 15 illustrated in FIG. 6 outputs the low level in the UMTS mode and outputs the high level in the GSM mode. The clamp signal generator 24 generates a clamp signal of the inverted output of the clamp signal generator 15.

The clamp signal generator 24 is illustrated with a configuration in which the output of the clamp signal generator 15 illustrated in FIG. 6 is inverted by an INV 25. However, it is possible to use a configuration in which the desired clamp signal is generated according to a combination of the terminal switch signal and the communication standard of the high frequency signal input to each of the high frequency terminals.

Also, the clamp signal generators 15a to 15c may be used instead of the clamp signal generator 15.

The clamper 14b includes a first transistor N2 connected between the voltage generator 7 and the ground. The first transistor N2 is an NMOS having a drain connected to the ground and a source connected to the low potential terminal 9a via an NMOS N3. The gate of the first transistor N2 is connected to the output of the clamp signal generator 24. A gate potential Vg of the first transistor N2 is controlled by the output of the clamp signal generator 24.

The NMOS N3 has a diode-like connection. The gate and the drain of the NMOS N3 are connected to the source of the first transistor N2; and the source of the NMOS N3 is connected to the low potential terminal 9a. The threshold voltage of the NMOS N3 is set to the value Vn_UMTS (e.g., –0.9 V) of the first potential optimal for the UMTS standard. The threshold voltage of the first transistor N2 is set to the value Vn_GSM–Vn_UMTS, which is the value Vn_UMTS optimal for the UMTS standard subtracted from the value Vn_GSM of the first potential optimal for the GSM standard.

For example, the threshold voltage of the first transistor N2 is set to −1.5 V−(−0.9 V)=−0.6 V.

The clamp signal is switched to the high level in the UMTS mode. A gate-source voltage Vgs of the first transistor N2 of the clamper 14b is much higher than that of the NMOS N3. A drain-source voltage Vds of the first transistor N2 decreases to substantially 0 V; and the clamping voltage of the clamper 14b is substantially equal to the threshold voltage of the NMOS N3. In other words, in the UMTS mode, the first potential Vn=Vn_UMTS (e.g., −0.9 V).

On the other hand, the clamp signal is switched to the low level in the GSM mode. The first transistor N2 has a diode-like connection in which the gate and drain are connected to each other and has a configuration similar to that of the NMOS N3. The clamping voltage of the clamper 14b is substantially equal to the sum of the threshold voltage of the first transistor N2 and the threshold voltage of the NMOS N3. In other words, in the GSM mode, the first potential Vn=Vn_GSM (e.g., −1.5 V).

Thus, according to the voltage controller 6e as well, similarly to the voltage controller 6 illustrated in FIG. 6, the third harmonic distortion can be reduced by setting the first potential Vn to the optimal value and the OFF distortion can be reduced for both the UMTS standard and the GSM standard without changing the FET size, the FET connection stage number, the layout, etc., of the switch unit 2.

Figure 16A:
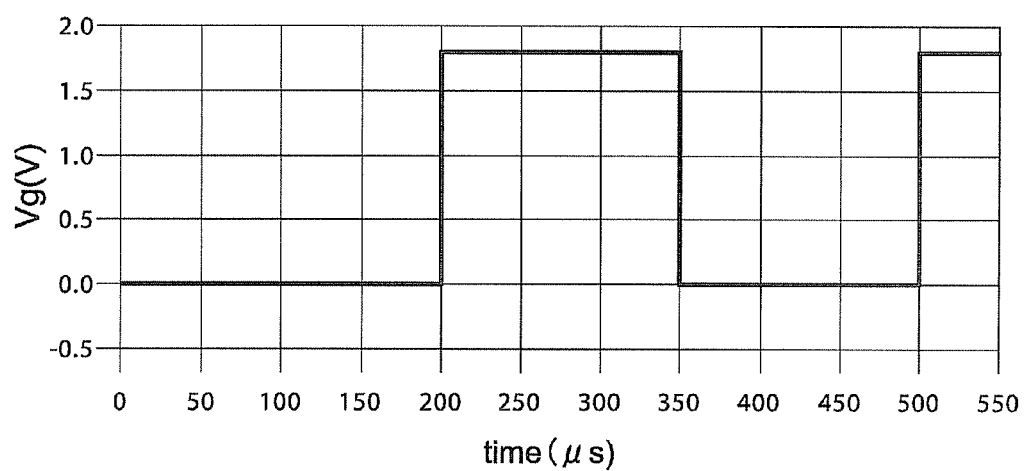
FIGS. 16A and 16B are waveform diagrams of main signals of the voltage controller illustrated in FIG. 15.
Figure 16B:
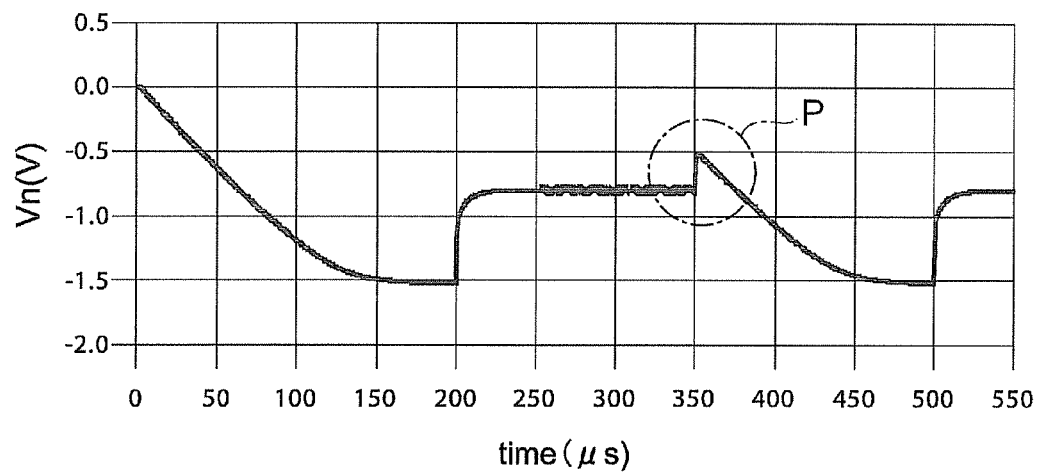

FIGS. 16A and 16B are waveform diagrams of main signals of the voltage controller illustrated in FIG. 15. FIG. 16A illustrates the gate potential Vg of the first transistor; and FIG. 16B illustrates the first potential Vn.

FIGS. 16A and 16B illustrate simulation results of the temporal change of the gate potential Vg and the first potential Vn of the first transistor N2 of the voltage controller 6e. The first potentials Vn optimal for the UMTS standard and the GSM standard are taken to be Vn_UMTS=−0.75 V and Vn_GSM=−1.5 V, respectively.

When the power supply is turned on at time=0 μs, the operation of the charge pump 12 of the voltage generator 7 starts and the first potential Vn decreases (FIG. 16B). At about time=150 μs, the first potential Vn saturates at −1.5 V (Vn_GSM) (FIG. 16B). At this point in time, the gate potential Vg of the first transistor N2 is 0 V (FIG. 16A), that is, the mode is the GSM mode.

At time=200 μs, the mode is switched to the UMTS mode and the gate potential Vg of the first transistor N2 is switched to the high level (FIG. 16A). The first potential Vn changes to −0.75 V (Vn_UMTS) (FIG. 16B).

At time=350 μs, the mode again is switched to the GSM mode and the gate potential Vg of the first transistor N2 is switched to the low level (FIG. 16A). The first potential Vn again changes to −1.5 V (Vn_GSM) (FIG. 16B).

A notch (the portion enclosed by the single dot-dash line P of FIG. 16B) occurs at time=350 μm where the first potential Vn increases (the absolute value decreases). This phenomenon occurs because the charge stored in the gates of the FETs of the SP8T switch unit 2 flows into the low potential terminal 9a.

At time=350 μs, the connection state of the switch unit 2 changes; and the OFF potential Voff is applied to the gates of the FETs to which the ON potential Von had been applied. The charge stored in the gates of the FETs to which the ON potential Von had been applied flows into the low potential terminal 9a via the driver 4. Therefore, the first potential Vn of the low potential terminal 9a increases and the notch occurs in the positive direction.

Such a phenomenon is undesirable and can be solved by providing the capacitor of the low-pass filter 13 of the voltage generator 7 with a large value of, for example, about 1 nF. However, it is difficult to provide a large capacitance of 1 nF inside an actual IC design.

Such a phenomenon can be eliminated by the following example.

Figure 17:
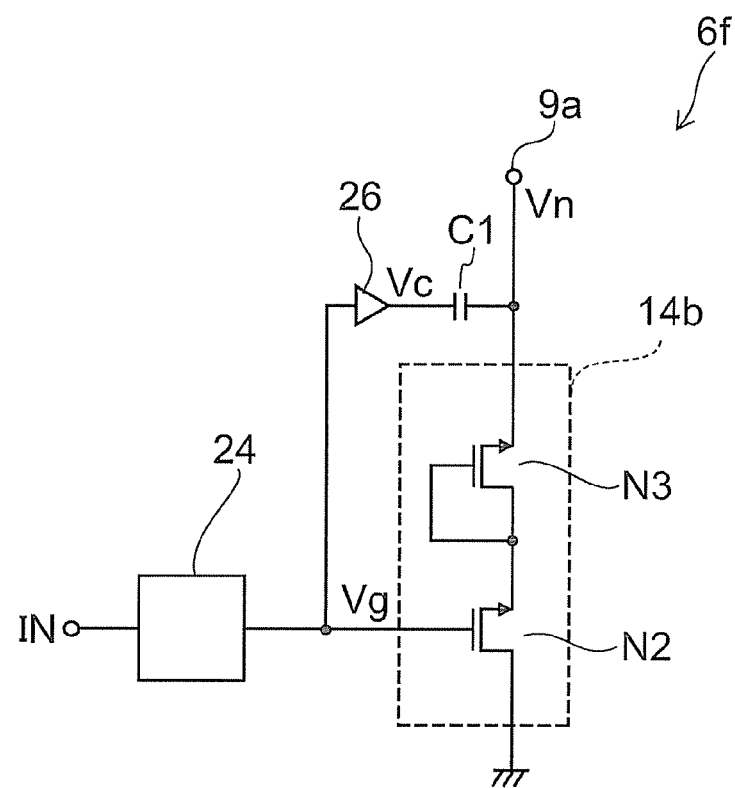
FIG. 17 is a circuit diagram illustrating another configuration of the voltage controller.

FIG. 17 is a circuit diagram illustrating another configuration of the voltage controller.

As illustrated in FIG. 17, the voltage controller 6f includes the clamper 14b, the clamp signal generator 24, a first capacitor C1, and the first buffer 26. The voltage controller 6f has a configuration in which the first capacitor C1 and the first buffer 26 are added to the voltage controller 6e illustrated in FIG. 15.

The first buffer 26 is connected to the output of the clamp signal generator 24 and receives input of the clamp signal. One terminal of the first capacitor C1 is connected to the output of the first buffer 26 and one other terminal is connected to the low potential terminal 9a.

Figure 18:
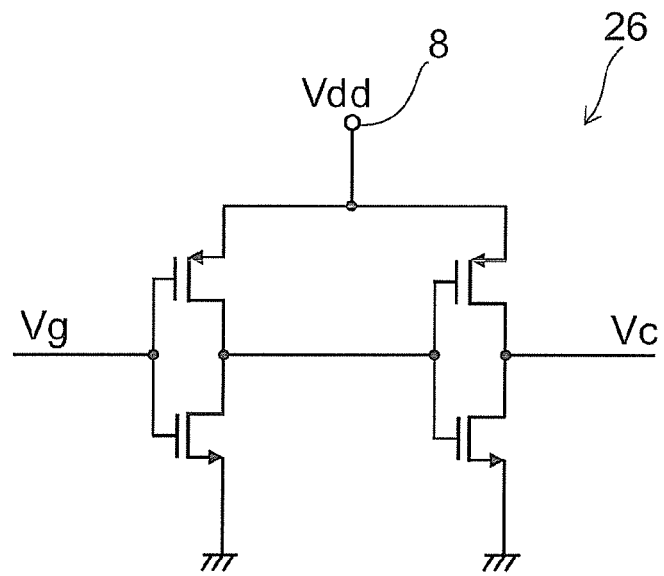
FIG. 18 is a circuit diagram illustrating the configuration of a first buffer illustrated in FIG. 17.

The first buffer 26 charges and discharges the first capacitor C1 according to the terminal switch signal. The first buffer 26 includes, for example, two stages of CMOS inverters as illustrated in FIG. 18.

In the GSM mode, the clamp signal output from the clamp signal generator 24 is the low level; and the first buffer 26 outputs substantially 0 V as the low level. The one terminal of the first capacitor C1 is the first potential Vn of Vn_GSM (e.g., −1.5 V). A potential Vc of the one other terminal of the first capacitor C1 is 0 V. A potential difference Vc−Vn between the two terminals of the first capacitor C1 is −Vn_GSM (e.g., 1.5 V).

In the UMTS mode, the clamp signal output from the clamp signal generator 24 is the high level; and the first buffer 26 outputs substantially the power supply voltage Vdd (e.g., 1.8 V) as the high level. The one terminal of the first capacitor C1 has the first potential Vn of Vn_UMTS (e.g., −0.75 V). The potential Vc of the one other terminal of the first capacitor C1 is the power supply voltage Vdd. The potential difference Vc−Vn between the two terminals of the first capacitor C1 is Vdd−Vn_UMTS (e.g., 2.55 V).

The potential difference Vc−Vn between the two terminals of the first capacitor C1 is high in the UMTS mode and low in the GSM mode. Therefore, the first capacitor C1 is discharged via a first buffer 26 when switching from the UMTS mode to the GSM mode. Because the potential Vc of the one other terminal of the first capacitor C1 changes from the high level of the power supply voltage Vdd to the low level of 0 V, if there is not charge movement, the first potential Vn of the one terminal becomes −(Vdd−Vn_UMTS) (e.g., −2.55 V).

Accordingly, the charge flowing into the low potential terminal 9a from the gates of the FETs of the switch unit 2 when the mode is switched from the UMTS mode to the GSM mode is absorbed by the first buffer 26 via the first capacitor C1. Thus, the first capacitor C1 compensates the flow of the charge stored in the gates of the FETs of the switch unit 2 into the low potential terminal 9a.

On the other hand, the first capacitor C1 discharges when the mode is switched from the GSM mode to the UMTS mode. At this time, the first potential Vn fluctuates because the potential Vc of the one other terminal of the first capacitor C1 changes. This is described below.

Figure 19A:
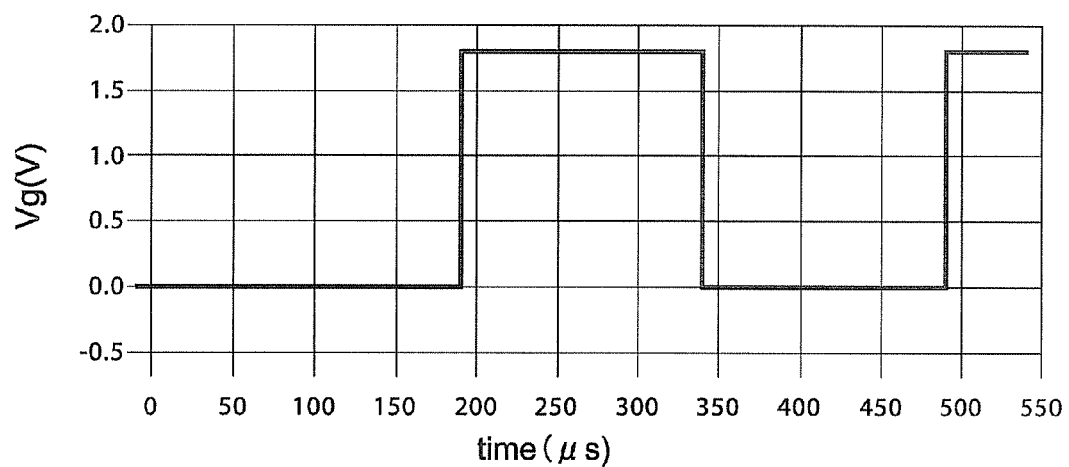
FIGS. 19A and 19B are waveform diagrams of main signals of the voltage controller illustrated in FIG. 17.
Figure 19B:
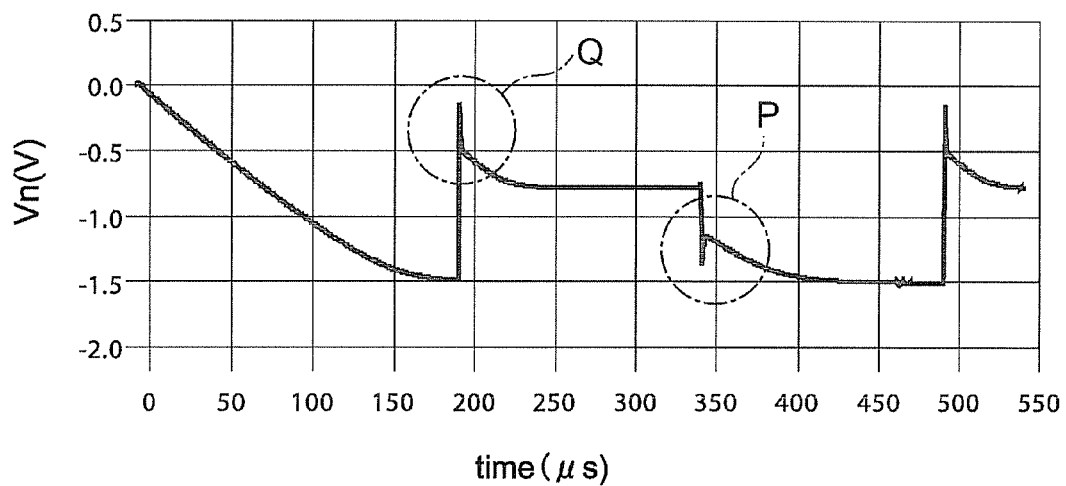

FIGS. 19A and 19B are waveform diagrams of main signals of the voltage controller illustrated in FIG. 17. FIG. 19A is the gate potential Vg of the first transistor; and FIG. 19B is the first potential Vn.

FIGS. 19A and 19B illustrate simulation results of the temporal change of the gate potential Vg and the first potential Vn of the first transistor N2 of the voltage controller 6f. The first potentials Vn optimal for the UMTS standard and the GSM standard are taken to be Vn_UMTS=−0.75 V and Vn_GSM=−1.5 V, respectively.

When the mode switches from the UMTS mode to the GSM mode at time=350 μs, the gate potential Vg of the first transistor N2 is switched from the high level to the low level (FIG. 19A). At this time, the notch (the portion enclosed by the single dot-dash line P of FIG. 19B) occurring in the first potential Vn is suppressed. Such an effect depends on the electrostatic capacitance of the first capacitor C1, the gain and the response rate of the first buffer 26, the electrostatic capacitance of the output capacitor Cn of the low-pass filter 13, the gate capacitances of the FETs of the switch unit 2, etc.

On the other hand, a positive notch (the portion enclosed by the single dot-dash line Q of FIG. 19B) occurs in the first potential Vn when the mode is switched from the GSM mode to the UMTS mode at time=200 μs. As recited above, this phenomenon occurs because the potential Vc of the one other terminal of the first capacitor C1 changes from 0 V of the GSM mode to the power supply voltage Vdd of the UMTS mode.

Although the pulse width of the notch is exceedingly short and the notch is not problematic during actual operation, this notch can be suppressed by the following example.

Figure 20:
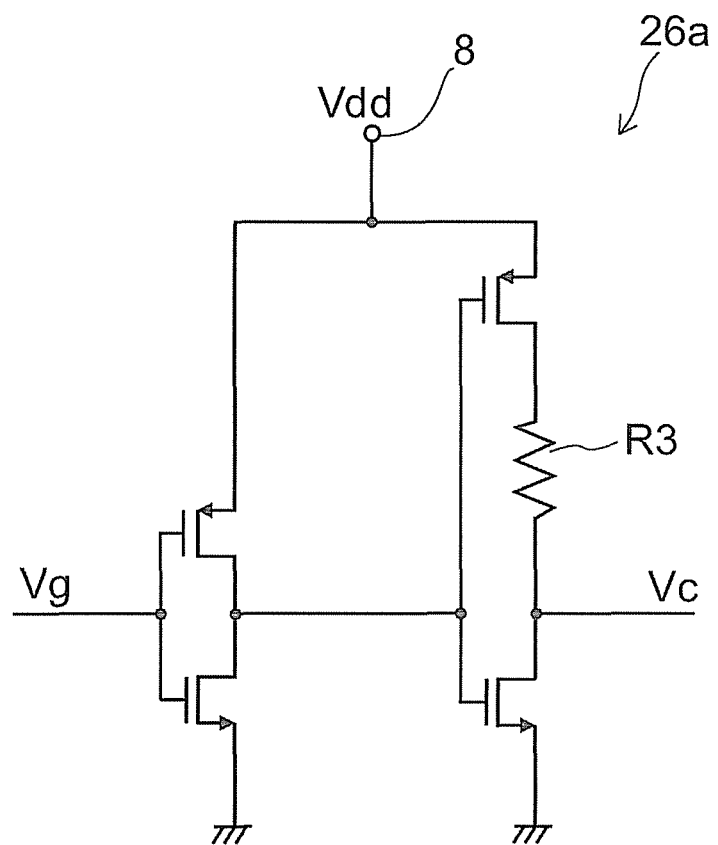
FIG. 20 is another circuit diagram illustrating the configuration of the first buffer illustrated in FIG. 17.

FIG. 20 is another circuit diagram illustrating the configuration of the first buffer illustrated in FIG. 17.

As illustrated in FIG. 20, a first buffer 26a has a configuration in which a resistor R3 is added between the drain and the output terminal of the PMOS of the CMOS inverter of the output stage of the first buffer 26 illustrated in FIG. 18. Otherwise, the first buffer 26a is similar to the first buffer 26 illustrated in FIG. 18.

In the first buffer 26a, the output resistance when the output signal changes from the low level to the high level is higher due to the resistor R3.

The resistor R3 and the first capacitor C1 form a low-pass filter to delay the ramp-up of the potential Vc of the one other terminal of the first capacitor C1 changing from 0 V of the low level to the power supply voltage Vdd of the high level.

Accordingly, the ramp-up of the potential Vc of the one other terminal of the first capacitor C1 is delayed when the mode is switched from the GSM mode to the UMTS mode.

Although the change of the first potential Vn which is the potential of the one terminal of the first capacitor C1 also is delayed due to the delay of the change of the potential Vc of the one other terminal of the first capacitor C1, it is clamped to the potential of Vn_UMTS by the clamper 14b.

Figure 21A:
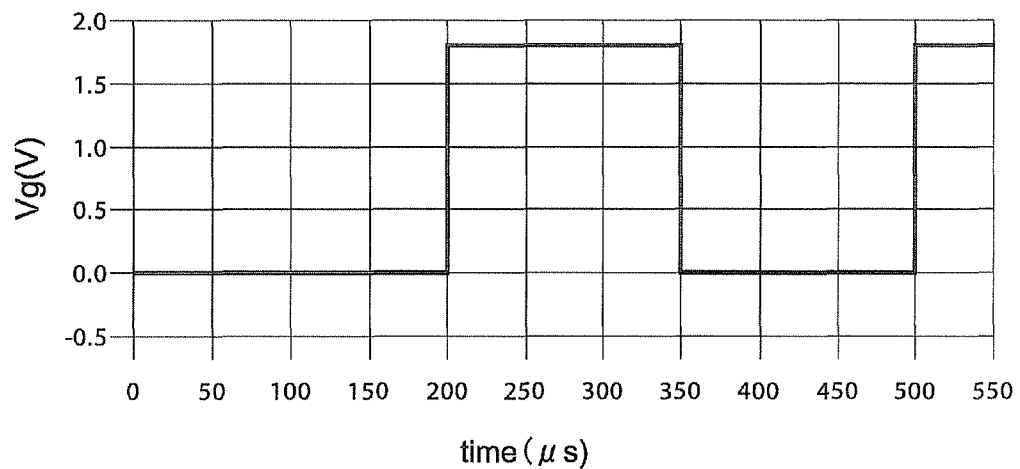
FIGS. 21A and 21B are waveform diagrams of main signals of the voltage controller using the first buffer of FIG. 20.
Figure 21B:
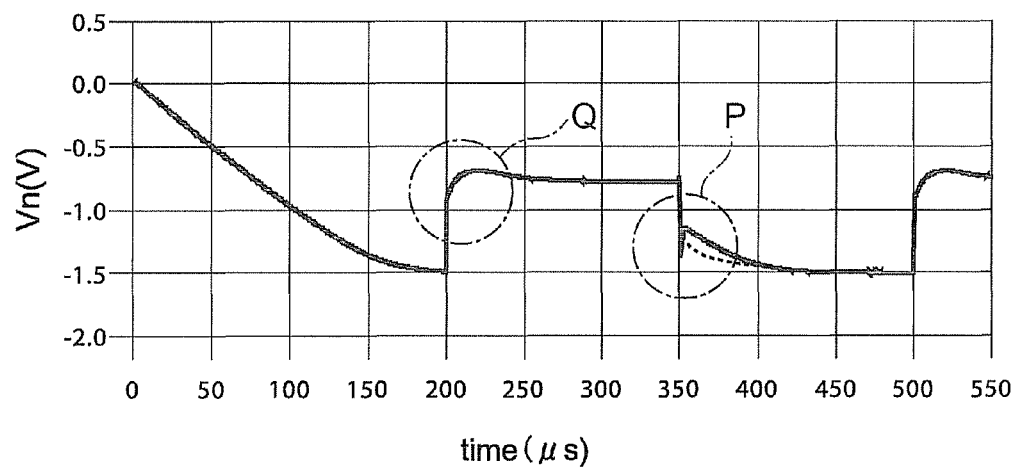

FIGS. 21A and 21B are waveform diagrams of main signals of the voltage controller using the first buffer of FIG. 20. FIG. 21A is the gate potential of the first transistor; and FIG. 21B is the first potential Vn.

FIGS. 21A and 21B illustrate simulation results of the temporal change of the gate potential Vg and the first potential Vn of the first transistor N2 of the voltage controller 6f in the case where the first buffer 26a is used. The first potentials Vn optimal for the UMTS standard and the GSM standard are taken to be Vn_UMTS=−0.75 V and Vn_GSM=−1.5 V, respectively.

When the mode switches from the GSM mode to the UMTS mode at time=200 μs, the gate potential Vg of the first transistor N2 switches from the low level to the high level (FIG. 21A). At this time, the occurrence of the notch (the portion enclosed by the single dot-dash line Q of FIG. 21B) in the first potential Vn is suppressed.

On the other hand, when the mode is switched from the UMTS mode to the GSM mode at time=350 μs, the notch (the portion enclosed by the single dot-dash line P of FIG. 21B) occurring in the first potential Vn also is suppressed. The waveform of the first potential Vn from the mode being switched from the UMTS mode to the GSM mode until the mode is again switched to the UMTS mode is similar to that of FIG. 19B.

The effects of the resistor R3 depend on the electrostatic capacitance of the first capacitor C1, the electrostatic capacitance of the output capacitor Cn of the low-pass filter 13, the gate capacitances of the FETs of the switch unit 2, etc.

Figure 22:
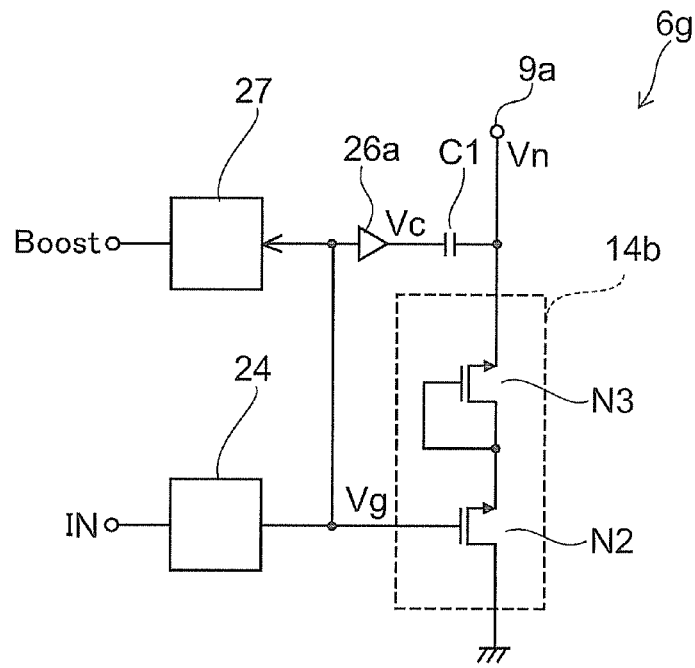
FIG. 22 is a circuit diagram illustrating another configuration of the voltage controller.

FIG. 22 is a circuit diagram illustrating another configuration of the voltage controller.

As illustrated in FIG. 22, the voltage controller 6g includes the clamper 14b, the clamp signal generator 24, the first capacitor C1, the first buffer 26a, and a pulse generator 27. The voltage controller 6g has a configuration in which the first buffer 26 of the voltage controller 6f illustrated in FIG. 17 is replaced with the first buffer 26a and the pulse generator 27 is added. The clamper 14b, the clamp signal generator 24, and the first capacitor C1 are similar to those of the voltage controller 6f illustrated in FIG. 17.

The pulse generator 27 is a circuit that generates a pulse having a constant width of a first time Tb as a Boost signal when the mode is switched from the UMTS mode to the GSM mode. Herein, the first time Tb is a short time compared to the switch time for each of the terminals of the semiconductor switch 1 to switch and is, for example, about 10 μs.

Figure 23A:
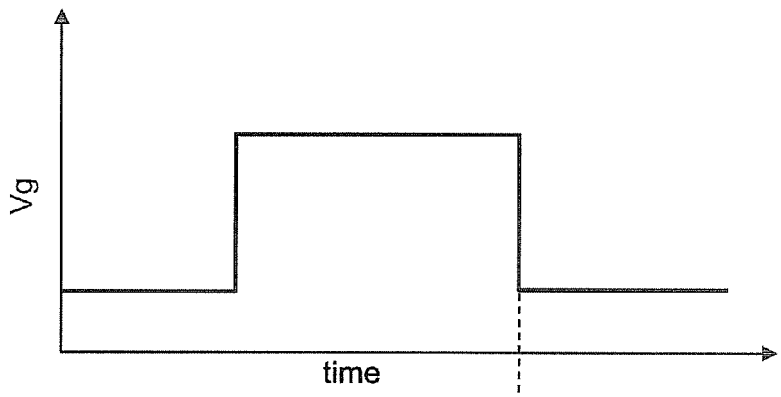
FIGS. 23A and 23B are waveform diagrams of main signals of the voltage controller illustrated in FIG. 22.
Figure 23B:
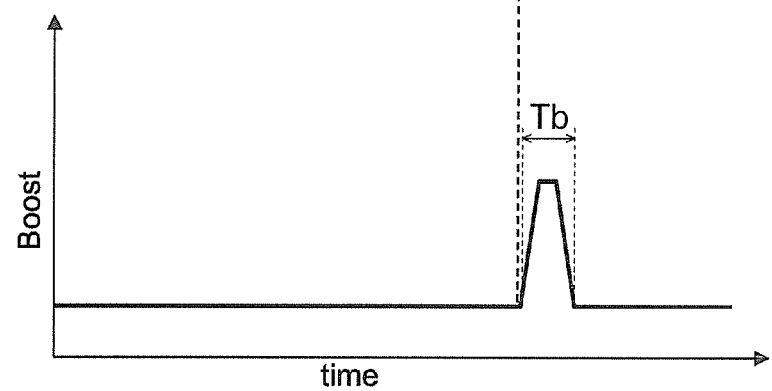

FIGS. 23A and 23B are waveform diagrams of main signals of the voltage controller illustrated in FIG. 22. FIG. 23A is the gate potential Vg of the first transistor; and FIG. 23B is the Boost signal.

The pulse generator 27 receives input of the gate potential Vg of the first transistor N2 as the clamp signal, detects the edge of the ramp-down, and generates the Boost signal having a pulse width of the first time Tb.

The fluctuation time of the first potential Vn can be shortened by controlling the output current of the voltage generator 7 according to the Boost signal.

For example, the output current of the voltage generator 7 can be controlled by changing the oscillation frequency and the driving capacity by the Boost signal in the oscillator 11 of the voltage generator 7.

Figure 24:
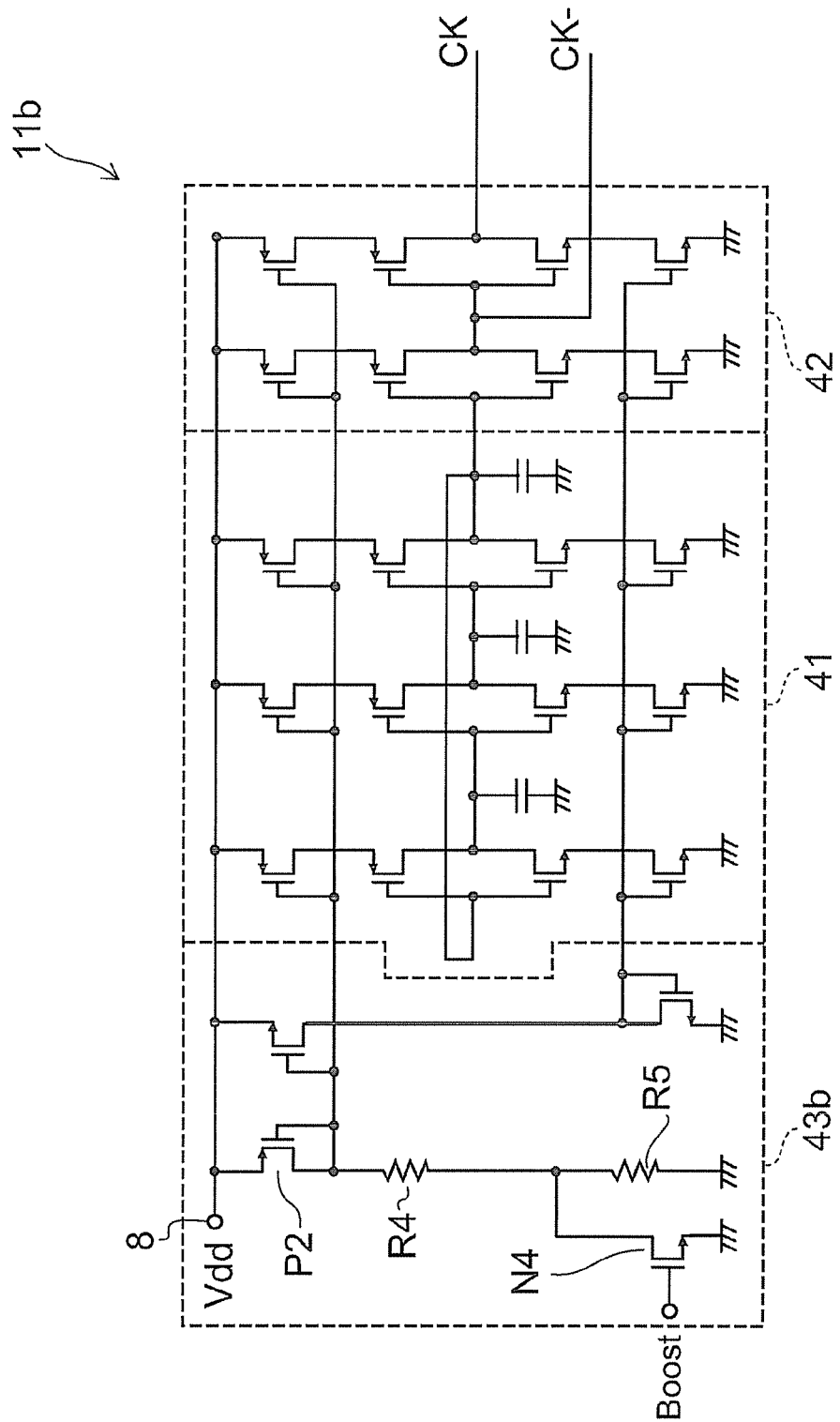
FIG. 24 is a circuit diagram illustrating the configuration of an oscillator used in the voltage generator.

FIG. 24 is a circuit diagram illustrating the configuration of the oscillator used in the voltage generator.

As illustrated in FIG. 24, an oscillator 11b has a configuration in which the current of the current mirror of the oscillator 11 of the voltage generator 7 illustrated in FIG. 5 can be controlled by the Boost signal.

The oscillator 11b includes the ring oscillator 41, the output buffer 42, and a bias circuit 43b. The oscillator 11b has a configuration in which the bias circuit 43 of the oscillator 11 illustrated in FIG. 5 is replaced with the bias circuit 43b.

The bias circuit 43b includes a PMOS P2 on the reference side of the current mirror, resistors R4 and R5, and an NMOS N4. The PMOS P2 has a diode-like connection; the gate and the drain of the PMOS P2 are connected to one terminal of the resistor R4; and the source of the PMOS P2 is connected to the power supply terminal 8. One other terminal of the resistor R4 is connected to the ground via the resistor R5.

The gate and the drain of the PMOS P2 are connected to the gates of another PMOSs of the current mirror and are supplied with a bias. The drain and the source of the NMOS N4 are connected to the two terminals of the resistor R5, respectively. The Boost signal is input to the gate of the NMOS N4.

When the Boost signal is the high level, the NMOS N4 is switched ON and both terminals of the resistor R5 are shorted. The current of the current mirror is specified by the resistor R4 and increases; and the oscillation frequency of the ring oscillator 41 and the current driving capability of the output buffer 42 increase. Thereby, the capacity of the charge pump 12 increases; and the time for the first potential Vn to reach the desired value (e.g., −1.5 V) after the mode is switched from the UMTS mode to the GSM mode is shortened. In other words, the switch time from the UMTS mode to the GSM mode is shortened. For example, in the case where the first time Tb is 50 μs, the first potential Vn is as illustrated by the broken line of FIG. 21B.

When the Boost signal is the low level, the NMOS N4 is switched OFF and the short of both terminals of the resistor R5 is released. The current of the current mirror is specified by the resistors R4 and R5 and decreases; and the oscillation frequency of the ring oscillator 41 and the current driving capability of the output buffer 42 decreases.

Because the time that the Boost signal is the high level is short, the increase of power consumption due to the increase of the oscillation frequency of the ring oscillator 41 and the current driving capability of the output buffer 42 is slight.

FIG. 24 illustrates the configuration in which the current of the current mirror is controlled by adding the NMOS N4 and the like to the oscillator 11. However, as illustrated in FIG. 14, a configuration may be used in which the NMOS N1 and the resistor R1 are added.

Moreover, FIG. 22 illustrates the configuration in which the voltage controller 6g includes the clamper 14b, the clamp signal generator 24, the first capacitor C1, the first buffer 26a, and the pulse generator 27. However, the pulse generator 27 may be added to the voltage controllers 6 to 6f; and the oscillator 11a and 11b also may be used.

In the semiconductor switch 1 as illustrated in FIG. 1, the power supply voltage Vdd is supplied to the high potential terminal 9 of the driver 4. However, a positive voltage generator that generates a second potential Vp higher than the power supply voltage Vdd may be further provided; and the second potential Vp of the high potential terminal 9 of the driver 4 may be supplied.

Although the case is described as an example in which the semiconductor switch 1 has a SP8T configuration, the semiconductor switch may similarly have a kPnT (k-Pole n-Throw) configuration (k and n are integers not less than 1).

Figure 25:
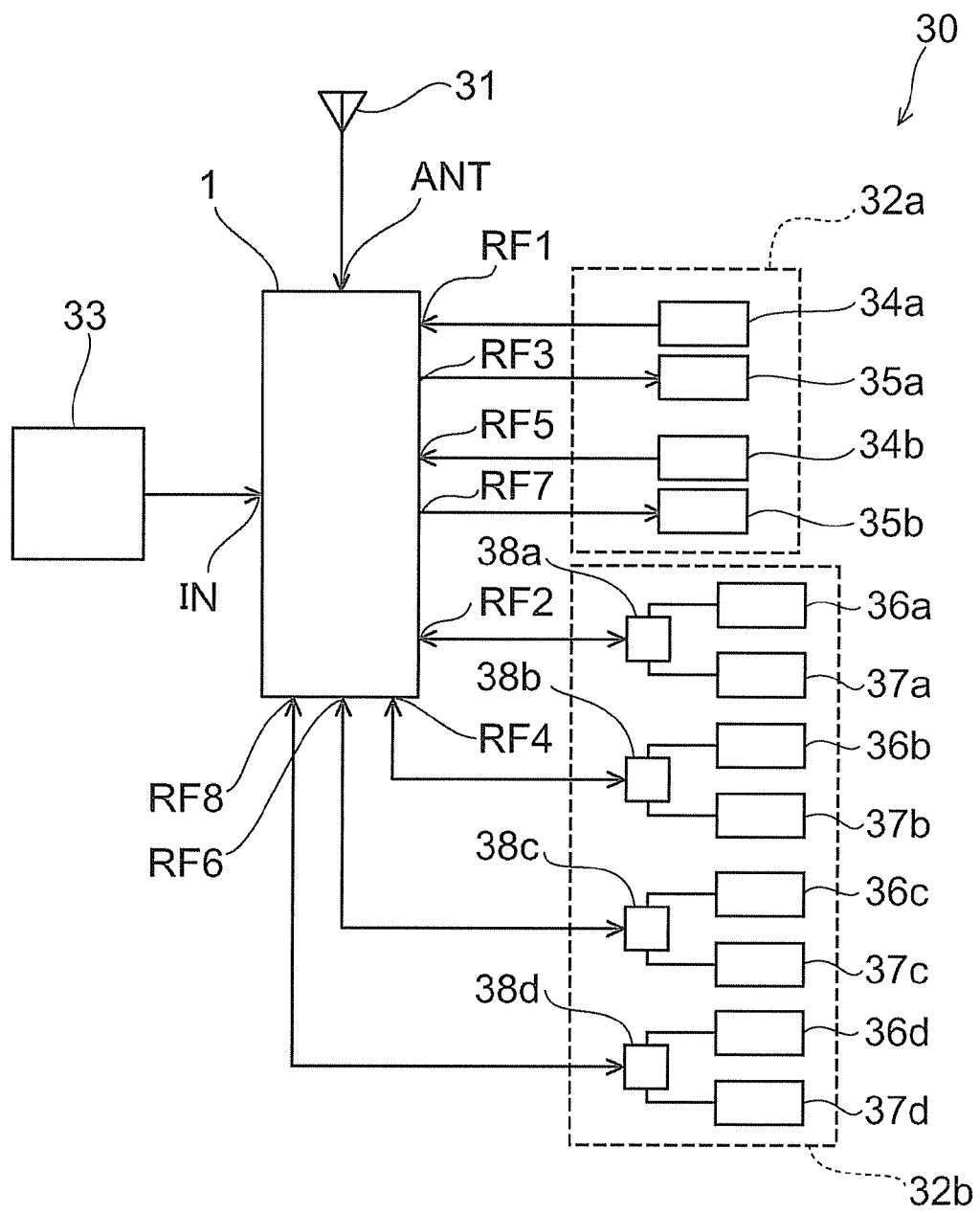
FIG. 25 is a block diagram illustrating the configuration of a wireless device including the semiconductor switch according to the embodiment.

FIG. 25 is a block diagram illustrating the configuration of a wireless device including the semiconductor switch according to the embodiment.

As illustrated in FIG. 25, the wireless device 30 includes the semiconductor switch 1, an antenna 31, a GSM transmitting and receiving circuit 32a, a UMTS transmitting and receiving circuit 32b, and a wireless controller 33.

Similarly to the semiconductor switch 1 illustrated in FIG. 1, the semiconductor switch 1 switches the connection between the antenna terminal ANT and any one of the eight high frequency terminals RF1 to RF8 based on the terminal switch signal input to the terminal IN.

The antenna terminal ANT is connected to the antenna 31. The high frequency terminals RF1 to RF8 are connected to the GSM transmitting and receiving circuit 32a and the UMTS transmitting and receiving circuit 32b.

The antenna 31 sends and receives high frequency signals of, for example, 800 MHz to 2 GHz in bands corresponding to the wireless communication of a mobile telephone, e.g., the GSM standard and the UMTS standard.

The GSM transmitting and receiving circuit 32a includes transmitting circuits 34a and 34b and receiving circuits 35a and 35b. The transmitting circuit 34a modulates a transmission signal including information such as a voice signal, an image signal, binary data, etc., into a high frequency signal of the GSM standard and outputs to the high frequency terminal RF1 of the semiconductor switch 1. The transmitting circuit 34b modulates a transmission signal into a high frequency signal of the GSM standard and outputs to the high frequency terminal RF5 of the semiconductor switch 1.

The receiving circuit 35a receives a high frequency signal of the GSM standard input from the high frequency terminal RF3 and demodulates into a received signal made of information such as a voice signal, an image signal, binary data, etc. The receiving circuit 35b receives a high frequency signal of the GSM standard input from the high frequency terminal RF7 and demodulates the received signal.

The UMTS transmitting and receiving circuit 32b includes transmitting circuits 36a to 36d, receiving circuits 37a to 37d, and duplexers 38a to 38d.

The transmitting circuit 36a modulates a transmission signal into a high frequency signal of the UMTS standard and outputs to the high frequency terminal RF2 via the duplexer 38a. The receiving circuit 37a receives a high frequency signal of the UMTS standard input from the high frequency terminal RF2 via the duplexer 38a and demodulates into a received signal.

The transmitting circuit 36b modulates a transmission signal into a high frequency signal of the UMTS standard and outputs to the high frequency terminal RF4 via the duplexer 38b. The receiving circuit 37b receives a high frequency signal of the UMTS standard input from the high frequency terminal RF4 via the duplexer 38b and demodulates into a received signal.

The transmitting circuit 36c modulates a transmission signal into a high frequency signal of the UMTS standard and outputs to the high frequency terminal RF6 via the duplexer 38c. The receiving circuit 37c receives a high frequency signal of the UMTS standard input from the high frequency terminal RF6 via the duplexer 38c and demodulates into a received signal.

The transmitting circuit 36d modulates a transmission signal into a high frequency signal of the UMTS standard and outputs to the high frequency terminal RF8 via the duplexer 38d. The receiving circuit 37d receives a high frequency signal of the UMTS standard input from the high frequency terminal RF8 via the duplexer 38d and demodulates into a received signal.

The wireless controller 33 outputs a terminal switch signal to the terminal IN of the semiconductor switch 1 to control the connection between the antenna terminal ANT and the high frequency terminals RF1 to EF8 of the semiconductor switch 1. The GSM transmitting and receiving circuit 32a and the UMTS transmitting and receiving circuit 32b also are controlled. In other words, the transmitting circuits 34a, 34b, and 36a to 36d and the receiving circuits 35a, 35b, and 37a to 37d are controlled.

For example, when transmitting using the transmitting circuit 34a of the GSM transmitting and receiving circuit 32a, the wireless controller 33 outputs the terminal switch signal to the terminal IN of the semiconductor switch 1 to connect the antenna terminal ANT to the high frequency terminal RF1 of the semiconductor switch 1.

In the semiconductor switch 1 as recited above, the first potential Vn optimal for the GSM standard is used when the antenna terminal ANT and the odd-numbered high frequency terminals RF1, RF3, RF5, and RF7 are in the conducting state.

In the semiconductor switch 1, the first potential Vn optimal for the UMTS standard is used when the antenna terminal ANT and the even-numbered high frequency terminals RF2, RF4, RF6, and RF8 are in the conducting state.

Therefore, according to the wireless device 30, the OFF distortion of the semiconductor switch 1 can be reduced and it is possible to transmit a high frequency signal of each of the GSM standard and the UMTS standard from the antenna 31.

In the wireless device 30 illustrated in FIG. 25, the modulation and the demodulation are performed by the transmitting circuits 34a, 34b and 36a to 36d and the receiving circuits 35a, 35b, and 37a to 37d, respectively. However, a configuration may be used in which a common modulator and demodulator is provided, a modulated signal is output to the transmitting circuit, and the signal input from the receiving circuit is demodulated.

FIG. 25 illustrates the configuration of a 2-band GSM and 4-band UMTS wireless device using the SP8T semiconductor switch 1 illustrated in FIG. 1. However, the voltage controllers 6a to 6g illustrated in FIG. 11 to FIG. 15, FIG. 17, and FIG. 22 may be used.

Moreover, although the GSM standard and the UMTS standard are described as examples of high frequency signals having different power levels Pin, other wireless communication standards may be used.

The wireless device 30 illustrated in FIG. 25 includes the multiple transmitting circuits 34a, 34b, and 36a to 36d and the multiple receiving circuits 35a, 35b, and 37a to 37d. However, a configuration may be used in which one transmitting circuit and one receiving circuit are provided and the first potential Vn is set to the optimal values during the transmitting and during the receiving.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. A semiconductor switch, comprising:
a voltage generator generating a negative first potential;
a voltage controller controlling the first potential according to a terminal switch signal input from an outside;
a driver being input the terminal switch signal, and outputting at least one selected from the first potential and a positive second potential by the terminal switch signal, the second potential being a power supply voltage or being higher than the power supply voltage; and
a switch unit provided on an SOI substrate, switching a connection between an antenna terminal and any one of high frequency terminals based on the output of the driver,
wherein the voltage controller includes a damper connected between an output of the voltage generator and a ground to control the first potential according to the terminal switch signal.

2. The switch according to claim 1, wherein the voltage controller includes:
a first capacitor having one terminal connected to the voltage generator; and
a first buffer connected to one other terminal of the first capacitor to charge and discharge the first capacitor according to the terminal switch signal.

3. The switch according to claim 2, wherein the first buffer charges and discharges the first capacitor with a higher output resistance when outputting a high level than when outputting a low level.

4. The switch according to claim 1, wherein the damper includes a first transistor connected between the voltage generator and the ground, a potential of a back gate of the first transistor being controlled according to the terminal switch signal.

5. The switch according to claim 4, wherein the voltage controller includes:
a first capacitor having one terminal connected to the voltage generator; and
a first buffer connected to one other terminal of the first capacitor to charge and discharge the first capacitor according to the terminal switch signal.

6. The switch according to claim 5, wherein the first buffer charges and discharges the first capacitor with a higher output resistance when outputting a high level than when outputting a low level.

7. The switch according to claim 1, wherein the voltage generator controls an output current according to the terminal switch signal, and the damper controls the first potential according to the output current.

8. The switch according to claim 7, wherein the voltage controller includes:
a first capacitor having one terminal connected to the voltage generator; and
a first buffer connected to one other terminal of the first capacitor to charge and discharge the first capacitor according to the terminal switch signal.

9. The switch according to claim 8, wherein the first buffer charges and discharges the first capacitor with a higher output resistance when outputting a high level than when outputting a low level.

10. The switch according to claim 1, wherein the damper includes a first transistor connected between the voltage generator and the ground, a gate potential of the first transistor being controlled according to the terminal switch signal.

11. The switch according to claim 10, wherein the voltage controller includes:
a first capacitor having one terminal connected to the voltage generator; and
a first buffer connected to one other terminal of the first capacitor to charge and discharge the first capacitor according to the terminal switch signal.

12. The switch according to claim 11, wherein the first buffer charges and discharges the first capacitor with a higher output resistance when outputting a high level than when outputting a low level.

13. The switch according to claim 1, wherein the voltage controller controls an output current of the voltage generator to have a first current value during a first time corresponding to a change of the terminal switch signal to reduce the first potential, and controls the output current of the voltage generator to have a second current value less than the first current value during a second time other than the first time.

14. The switch according to claim 13, wherein the voltage controller includes a damper connected between the voltage generator and a ground to control the first potential according to the terminal switch signal.

15. The switch according to claim 14, wherein the voltage controller includes:
a first capacitor having one terminal connected to the output of the voltage generator; and a first buffer connected to one other terminal of the first capacitor to charge and discharge the first capacitor according to the terminal switch signal.

16. The switch according to claim 14, wherein the damper includes a first transistor connected between the voltage generator and the ground, a potential of a back gate of the first transistor being controlled according to the terminal switch signal.

17. The switch according to claim 14, wherein the damper includes a first transistor connected between the voltage generator and the ground, a gate potential of the first transistor being controlled according to the terminal switch signal.

18. The switch according to claim 1, wherein the voltage controller includes a fuse circuit configured to mask a signal of the decoded terminal switch signal with a signal of a high level or a low level output via a breakable fuse.

19. A wireless device, comprising:
an antenna radiating and receiving radio waves;
a transmitting circuit modulating a transmission signal and transmitting the modulated transmission signal via the antenna;
a receiving circuit demodulating a high frequency signal received via the antenna;
a semiconductor switch having an antenna terminal connected to the antenna, a high frequency terminal connected to the transmitting circuit, and another high frequency terminal connected to the receiving circuit to switch between connecting the antenna to the transmitting circuit or the receiving circuit; and
a wireless controller outputting a terminal switch signal to the semiconductor switch, the semiconductor switch including:
a voltage generator generating a negative first potential;
a voltage controller controlling the first potential according to the terminal switch signal;
a driver is input the terminal switch signal and outputting at least one selected from the first potential and the second potential by the terminal switch signal, the second potential being a power supply voltage or being higher than the power supply voltage; and
a switch unit provided on an SOI substrate, switching a connection between the antenna terminal and any one of the high frequency terminals based on the putout of the driver,
wherein the voltage controller includes a damper connected between an output of the voltage generator and a ground to control the first potential according to the terminal switch signal.

20. A semiconductor switch, comprising:
a first terminal at which a first high frequency signal having a first power is input, the first power being a maximum power of the first high frequency signal;
a second terminal at which a second high frequency signal having a second power is input, the second power being a maximum power of the second high frequency signal, the second power being lower than the first power;
a voltage generator generating a negative first potential;
a driver configured to input a terminal switch signal input from, and to output at least one selected from the first potential and a positive second potential by the terminal switch signal, the second potential being a power supply voltage or being higher than the power supply voltage;
a switch unit including a MOSFET provided on an SOI substrate, switching a connection between an antenna terminal and one of the first terminal and the second terminal based on the output of the driver; and
a voltage controller configured to control the first potential in a moment inputting the second high frequency signal to a potential higher than the first potential in a moment inputting the first high frequency signal so that the voltage controller generates a gate voltage for the MOSFET to minimize a third harmonic generating from the MOSFET in off-state.

* * * * *